(12) United States Patent
Briggs et al.

(10) Patent No.: US 9,997,372 B2
(45) Date of Patent: *Jun. 12, 2018

(54) TECHNIQUE TO DEPOSIT SIDEWALL PASSIVATION FOR HIGH ASPECT RATIO CYLINDER ETCH

(71) Applicant: Lam Research Corporation, Fremont, CA (US)

(72) Inventors: Joseph Scott Briggs, Menlo Park, CA (US); Eric A. Hudson, Berkeley, CA (US)

(73) Assignee: Lam Research Corporation, Fremont, CA (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/157,303

(22) Filed: May 17, 2016

(65) Prior Publication Data

US 2016/0260620 A1 Sep. 8, 2016

Related U.S. Application Data

(63) Continuation of application No. 14/560,414, filed on Dec. 4, 2014, now Pat. No. 9,378,971.

(51) Int. Cl.
*H01L 21/311* (2006.01)
*H01L 21/3065* (2006.01)
(Continued)

(52) U.S. Cl.
CPC .. *H01L 21/31116* (2013.01); *H01J 37/32009* (2013.01); *H01J 37/3244* (2013.01);
(Continued)

(58) Field of Classification Search
CPC ......... H01L 21/31116; H01L 21/30655; H01L 27/103; H01L 27/115; H01J 37/32009;
(Continued)

(56) References Cited

U.S. PATENT DOCUMENTS 4,894,696 A 1/1990 Takeda
5,767,018 A 6/1998 Bell
(Continued)

OTHER PUBLICATIONS

Briggs et al., "Technique to Deposit Sidewall Passivation for High Aspect Ratio Cylinder Etch," U.S. Appl. No. 14/560,414, filed Dec. 4, 2014.
(Continued)

*Primary Examiner* — Duy Vu N Deo
(74) *Attorney, Agent, or Firm* — Weaver Austin Villeneuve & Sampson LLP

(57) ABSTRACT

Various embodiments herein relate to methods, apparatus and systems for forming a recessed feature in dielectric material on a semiconductor substrate. Separate etching and deposition operations are employed in a cyclic manner. Each etching operation partially etches the feature. Each deposition operation forms a protective coating on the sidewalls of the feature to prevent lateral etch of the dielectric material during the etching operations. The protective coating may be deposited using methods that result in formation of the protective coating along substantially the entire length of the sidewalls. The protective coating may be deposited using particular reactants having low sticking coefficients in some embodiments. The protective coating may also be deposited using particular reaction mechanisms that result in substantially complete sidewall coating. In some cases the protective coating is deposited using plasma assisted atomic layer deposition or plasma assisted chemical vapor deposition.

11 Claims, 9 Drawing Sheets

(51) Int. Cl.
*H01J 37/32* (2006.01)
*H01L 27/108* (2006.01)
*H01L 27/115* (2017.01)
*H01L 21/02* (2006.01)

(52) U.S. Cl.
CPC .. *H01J 37/32091* (2013.01); *H01J 37/32513* (2013.01); *H01J 37/32577* (2013.01); *H01J 37/32623* (2013.01); *H01J 37/32651* (2013.01); *H01J 37/32871* (2013.01); *H01J 37/32899* (2013.01); *H01L 21/30655* (2013.01); *H01L 27/108* (2013.01); *H01L 27/115* (2013.01); *H01J 2237/334* (2013.01); *H01L 21/0217* (2013.01); *H01L 21/0228* (2013.01); *H01L 21/02112* (2013.01); *H01L 21/02164* (2013.01); *H01L 21/02271* (2013.01); *H01L 21/02274* (2013.01)

(58) Field of Classification Search
CPC .............. H01J 37/32091; H01J 37/3244; H01J 37/32513; H01J 37/32623; H01J 37/32651; H01J 37/32871; H01J 37/32899
See application file for complete search history.

(56) References Cited

U.S. PATENT DOCUMENTS

| | | | |
|---|---|---|---|
| 5,948,704 A | 9/1999 | Benjamin et al. | |
| 6,841,943 B2 | 1/2005 | Vahedi et al. | |
| 7,105,390 B2 | 9/2006 | Brask et al. | |
| 7,732,728 B2 | 6/2010 | Dhindsa et al. | |
| 7,740,736 B2 | 6/2010 | Fischer et al. | |
| 8,552,334 B2 | 10/2013 | Tappan et al. | |
| 9,378,971 B1 * | 6/2016 | Briggs | H01L 21/30655 |
| 9,384,998 B2 * | 7/2016 | Hudson | H01L 21/31116 |
| 9,543,148 B1 | 1/2017 | Hudson et al. | |
| 9,543,158 B2 * | 1/2017 | Hudson | H01L 21/30655 |
| 9,548,188 B2 | 1/2017 | Hausmann | |
| 9,620,377 B2 * | 4/2017 | Hudson | H01L 21/30655 |
| 9,887,097 B2 | 2/2018 | Hudson | |
| 2005/0136682 A1 | 6/2005 | Hudson et al. | |
| 2006/0121721 A1 | 6/2006 | Lee et al. | |
| 2007/0026677 A1 | 2/2007 | Ji et al. | |
| 2008/0286978 A1 | 11/2008 | Chen et al. | |
| 2009/0163035 A1 | 6/2009 | Romano et al. | |
| 2009/0275202 A1 | 11/2009 | Tanaka et al. | |
| 2010/0009543 A1 * | 1/2010 | Cho | H01L 21/0206 438/735 |
| 2010/0173494 A1 | 7/2010 | Kobrin | |
| 2013/0316518 A1 | 11/2013 | Hollister et al. | |
| 2014/0038412 A1 | 2/2014 | Hu et al. | |
| 2014/0043216 A1 * | 2/2014 | Tang | G02B 26/001 345/32 |
| 2014/0065838 A1 | 3/2014 | Ellinger et al. | |
| 2015/0083582 A1 | 3/2015 | Dhindsa et al. | |
| 2016/0163556 A1 | 6/2016 | Briggs et al. | |
| 2016/0163557 A1 | 6/2016 | Hudson et al. | |
| 2016/0163558 A1 | 6/2016 | Hudson et al. | |
| 2016/0163561 A1 | 6/2016 | Hudson et al. | |
| 2016/0260617 A1 | 9/2016 | Hudson et al. | |
| 2016/0268141 A1 | 9/2016 | Hudson | |
| 2016/0343580 A1 | 11/2016 | Hudson | |
| 2017/0076945 A1 | 3/2017 | Hudson et al. | |
| 2017/0076955 A1 | 3/2017 | Hudson et al. | |
| 2017/0170026 A1 | 6/2017 | Hudson et al. | |
| 2017/0178920 A1 | 6/2017 | Dole et al. | |

OTHER PUBLICATIONS

Hudson et al., "Technique to Deposit Sidewall Passivation for High Aspect Ratio Cylinder Etch," U.S. Appl. No. 14/724,574, filed May 28, 2015.

Hudson et al., "Technique to Deposit Sidewall Passivation for High Aspect Ratio Cylinder Etch ," U.S. Appl. No. 14/697,521, filed Apr. 27, 2015.

Hausmann, Dennis Michael, "Method of Conditioning Vacuum Chamber of Semiconductor Substrate Processing Apparatus," U.S. Appl. No. 14/446,427, filed Jul. 30, 2014.

Hudson et al., "Technique to Deposit Metal-Containing Sidewall Passivation for High Aspect Ratio Cylinder Etch," U.S. Appl. No. 14/803,578, filed Jul. 20, 2015.

U.S. Office Action, dated Nov. 19, 2015, issued in U.S. Appl. No. 14/560,414.

U.S. Notice of Allowance, dated Apr. 6, 2016, issued in U.S. Appl. No. 14/560,414.

U.S. Office Action, dated Sep. 8, 2015, issued in U.S. Appl. No. 14/724,574.

U.S. Final Office Action, dated Dec. 18, 2015, issued in U.S. Appl. No. 14/724,574.

U.S. Notice of Allowance, dated Mar. 1, 2016, issued in U.S. Appl. No. 14/724,574.

Yang et al. (2006) "CVD Growth Kinetics of $HfB_2$ Thin Films from the Single-Source Precursor $Hf(BH_4)_4$," *Chem. Mater.*, American Chemical Society, 18(21):5088-5096.

Yanguas-Gil et al. (Sep./Oct. 2009) "Highly conformal film growth by chemical vapor deposition. II. Conformality enhancement through growth inhibition," *Journal of Vacuum Science & Technology A*, 27(5): 1244-1248.

Zhou, Han and Bent, Stacey F. (Jul./Aug. 2013) "Fabrication of organic interfacial layers by molecular layer deposition: Present status and future opportunities," *Journal of Vacuum Science Technology A*, American Vacuum Society, 31(4), 040801-1-040801-18.

U.S. Office Action, dated Jul. 11, 2016, issued in U.S. Appl. No. 14/697,521.

U.S. Notice of Allowance, dated Nov. 14, 2016, issued in U.S. Appl. No. 14/697,521.

U.S. Notice of Allowance (corrected Notice of Allowability), dated Dec. 5, 2016, issued in U.S. Appl. No. 14/697,521.

U.S. Office Action, dated Jul. 26, 2016, issued in U.S. Appl. No. 14/803,578.

U.S. Notice of Allowance, dated Dec. 5, 2016, issued in U.S. Appl. No. 14/803,578.

U.S. Office Action, dated Jun. 15, 2016, issued in U.S. Appl. No. 14/842,733.

U.S. Notice of Allowance, dated Nov. 9, 2016, issued in U.S. Appl. No. 14/842,733.

U.S. Notice of Allowance, dated Dec. 8, 2016, issued in U.S. Appl. No. 14/842,733.

U.S. Office Action, dated May 12, 2017, issued in U.S. Appl. No. 15/163,123.

U.S. Office Action, dated Aug. 4, 2017, issued in U.S. Appl. No. 15/225,489.

Engelhardt et al. (1988) "Deep Trench Etching Using $CBrF_3$ and $CBrF_3$/Chlorine Gas Mixtures," *Siemens AG*, Otto-Halm-Ring, 8000 Munich 83, Germany, pp. 48-54.

Hanson et al. (2003) "Bonding Self-Assembled, Compact Organophosphonate Monolayers to the Native Oxide Surface of Silicon," *J. Am. Chem. Soc.*,125(51):16074-16080.

Jung et al. (2005) "Vapor-Phase Self-Assembled Monolayer for Improved Mold Release in Nanoimprint Lithography," *Langmuir*, 21(4):1158-1161.

Matsuo (May 1, 1980) "Selective etching of Si relative to $SiO_2$ without undercutting by $CBrF_3$ plasma," *Applied Physics Letters*, 36(9):768-770.

Ohiwa et al. (1990) "SiO2 Tapered Etching Employing Magnetron Discharge," *1990 Dry Process Symposium*, ULSI Research Center, Toshiba Corp., V-3, pp. 105-109.

Ohiwa et al. (Feb. 1992) "SiO2 Tapered Etching Employing Magnetron Discharge of Fluorocarbon Gas," *Jpn. J. Appl. Phys.*, 31(Part 1, 2A):405-410.

Zhuang et al. (2006) "Thermal stability of vapor phase deposited self-assembled monolayers for MEMS anti-stiction," *J. Micromech. Microeng.*, 16:2259-2264.

U.S. Appl. No. 15/475,021, filed Mar. 30, 2017, Hudson et al.

U.S. Appl. No. 15/667,551, filed Aug. 2, 2017, Eason et al.

(56) References Cited

OTHER PUBLICATIONS

PCT International Search Report and Written Opinion dated Nov. 9, 2017 issued in PCT/US2017/044986.
U.S. Final Office Action, dated Dec. 21, 2017, issued in U.S. Appl. No. 15/225,489.
U.S. Notice of Allowance, dated Feb. 9, 2018, issued in U.S. Appl. No. 15/225,489.
U.S. Office Action dated Apr. 3, 2018 issued in U.S. Appl. No. 15/440,842.
U.S. Office Action, dated Feb. 5, 2018, issued in U.S. Appl. No. 15/475,021.

* cited by examiner

TECHNIQUE TO DEPOSIT SIDEWALL PASSIVATION FOR HIGH ASPECT RATIO CYLINDER ETCH

CROSS-REFERENCE TO RELATED APPLICATION

This application is a continuation of and claims priority to U.S. patent application Ser. No. 14/560,414, titled "TECHNIQUE TO DEPOSIT SIDEWALL PASSIVATION FOR HIGH ASPECT RATIO CYLINDER ETCH," filed Dec. 4, 2014, all of which is incorporated herein by this reference and for all purposes.

BACKGROUND

One process frequently employed during fabrication of semiconductor devices is formation of an etched cylinder in dielectric material. Example contexts where such a process may occur include, but are not limited to, memory applications such as DRAM and 3D NAND structures. As the semiconductor industry advances and device dimensions become smaller, such cylinders become increasingly harder to etch in a uniform manner, especially for high aspect ratio cylinders having narrow widths and/or deep depths.

SUMMARY

Certain embodiments herein relate to methods and apparatus for forming an etched feature in dielectric material on a semiconductor substrate. The disclosed embodiments may utilize certain techniques to deposit a passivating material on sidewalls of the etched feature, thereby allowing etch to occur at high aspect ratios.

In one aspect of the embodiments herein, a method is provided for forming an etched feature in dielectric material on a semiconductor substrate, the method including: (a) generating a first plasma including an etching reactant, exposing the substrate to the first plasma, and partially etching the feature in the dielectric material; (b) after (a), depositing a protective film on sidewalls of the feature, where the protective film is deposited along substantially the entire depth of the feature; (c) repeating (a)-(b) until the feature is etched to a final depth, where the protective film deposited in (b) substantially prevents lateral etch of the feature during (a), and where the feature has an aspect ratio of about 5 or greater at its final depth.

In certain embodiments, the protective film is formed using precursors having a sticking coefficient of about 0.05 or less under conditions used to deposit the protective film. At the final depth, the feature may have an aspect ratio of about 20 or greater, and a bow of about 20% or less.

The disclosed embodiments may be used in a variety of contexts. In some cases, the feature is formed in the context of forming a VNAND device, where the dielectric material includes alternating layers of (i) an oxide material, and (ii) a nitride material or polysilicon material. In some other cases, the feature is formed in the context of forming a DRAM device, where the dielectric material includes silicon oxide.

In various implementations, operation (b) includes depositing the protective film through a plasma assisted atomic layer deposition reaction including: (i) exposing the substrate to a first deposition reactant and allowing the first deposition reactant to adsorb onto the sidewalls of the feature; (ii) after (i), exposing the substrate to a second plasma including a second deposition reactant, where exposing the substrate to the second plasma drives a surface reaction between the first deposition reactant and the second deposition reactant, thereby forming the protective film on the sidewalls of the feature. The first deposition reactant includes a boron-containing reactant in some cases. Alternatively or in addition, the first deposition reactant may include a silicon-containing reactant. In certain embodiments, the second deposition reactant includes a nitrogen-containing reactant, and the protective film includes boron nitride. In some cases, operation (a) further includes oxidizing the boron nitride protective film formed in (b) to form a boron oxide protective film. In some such cases, the first deposition reactant includes $BCl_3$, the second deposition reactant includes $N_2$ and $H_2$, the etch reactant in (a) includes one or more fluorocarbons and $O_2$, and the method further includes during (a) oxidizing the boron nitride protective film to form boron oxide.

In some embodiments, operation (b) includes depositing the protective film through a plasma assisted chemical vapor deposition reaction including exposing the substrate to a first deposition reactant and a second deposition reactant while the substrate is exposed to a second plasma, where the second plasma drives a reaction that results in deposition of the protective film on the sidewalls of the feature. The first deposition reactant may include a boron-containing reactant and/or a silicon-containing reactant, and the protective film may be a boron-containing film and/or a silicon-containing film. In some cases, the first deposition reactant includes $BCl_3$, the second deposition reactant includes $N_2$ and $H_2$, and the protective film formed in (b) is boron nitride, where the etching reactant in (a) includes one or more fluorocarbons and $O_2$, and further including during (a), converting the boron nitride protective film to boron oxide. In various embodiments, the protective layer includes fluorocarbon polymer.

The feature may be a high aspect ratio feature. In some cases the feature has an aspect ratio of at least about 5, for example at least about 10, at least about 20, at least about 30, at least about 40, at least about 50, at least about 60, at least about 80, or at least about 100. In a particular example the aspect ratio of the feature is at least about 50. Operations (a) and (b) may be repeated a number of times. In some cases, (a) and (b) are repeated at least once. In some cases, (a) and (b) are repeated at least twice, at least three times, at least five times, or at least ten times.

In another aspect of the disclosed embodiments, an apparatus for forming an etched feature in dielectric material on a semiconductor substrate is provided, the apparatus including: one or more reaction chambers, where at least one reaction chamber is designed or configured to perform etching, and where at least one reaction chamber is designed or configured to perform deposition, each reaction chamber including: an inlet for introducing process gases to the reaction chamber, an outlet for removing material from the reaction chamber, and a plasma source; and a controller having instructions for: (a) generating a first plasma including an etching reactant, exposing the substrate to the first plasma, and partially etching the feature in the dielectric material, where (a) is performed in the reaction chamber designed or configured to perform etching; (b) after (a), depositing a protective film on sidewalls of the feature, where the protective film is deposited along substantially the entire depth of the feature, and where (b) is performed in the reaction chamber designed or configured to perform deposition; (c) repeating (a)-(b) until the feature is etched to a final depth, where the protective film deposited in (b)

substantially prevents lateral etch of the feature during (a), and where the feature has an aspect ratio of about 5 or greater at its final depth.

In some embodiments, the reaction chamber designed or configured to perform etching is the same reaction chamber designed or configured to perform deposition, such that both (a) and (b) occur in the same reaction chamber. In other embodiments, the reaction chamber designed or configured to perform etching is different from the reaction chamber designed or configured to perform deposition, and the controller further includes instructions to transfer the substrate between the reaction chamber designed or configured to perform etching and the reaction chamber designed or configured to perform deposition.

These and other features will be described below with reference to the associated drawings.

DETAILED DESCRIPTION

Figure 1:
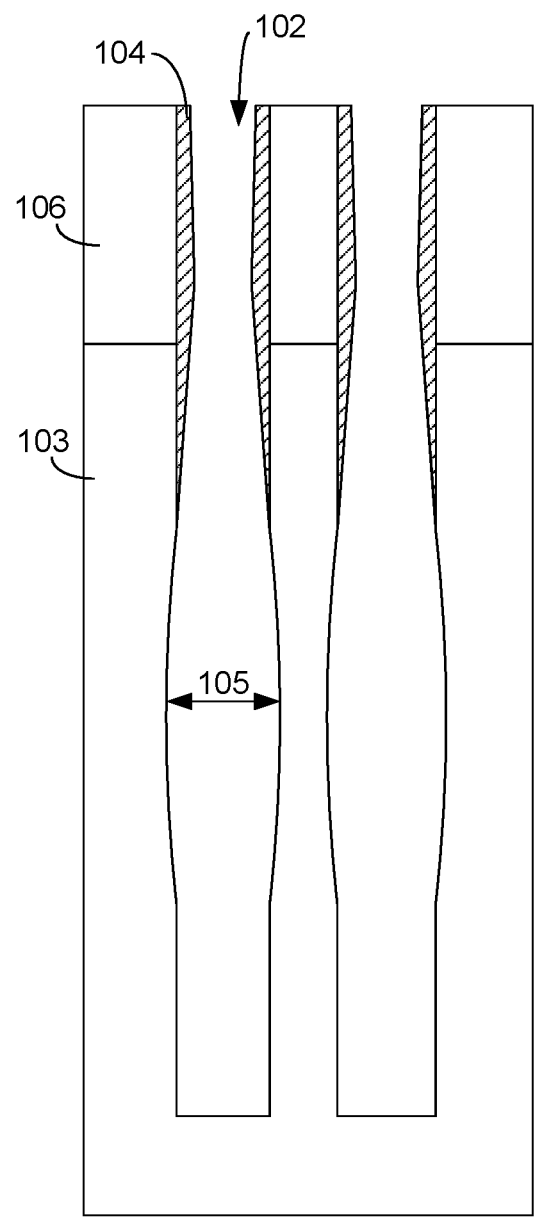
FIG. 1 illustrates an etched cylinder having an undesirable bow due to over-etching of the sidewalls.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards, magnetic recording media, magnetic recording sensors, mirrors, optical elements, micro-mechanical devices and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

I. Technology for Etching High Aspect Ratio Features in a Dielectric Material

Fabrication of certain semiconductor devices involves etching features into a dielectric material or materials. The dielectric material may be a single layer of material or a stack of materials. In some cases a stack includes alternating layers of dielectric material (e.g., silicon nitride and silicon oxide). One example etched feature is a cylinder, which may have a high aspect ratio. As the aspect ratio of such features continues to increase, it is increasingly challenging to etch the features into dielectric materials. One problem that arises during etching of high aspect ratio features is a non-uniform etching profile. In other words, the features do not etch in a straight downward direction. Instead, the sidewalls of the features are often bowed such that a middle portion of the etched feature is wider (i.e., further etched) than a top and/or bottom portion of the feature. This over-etching near the middle portion of the features can result in compromised structural and/or electronic integrity of the remaining material.

Without being bound by any theory or mechanism of action, it is believed that the over-etching at the middle portion of the cylinder or other feature occurs at least partially because the sidewalls of the cylinder are insufficiently protected from etching. Conventional etch chemistry utilizes fluorocarbon etchants to form the cylinders in the dielectric material. The fluorocarbon etchants are excited by plasma exposure, which results in the formation of various fluorocarbon fragments including, for example, CF, $CF_2$, and $CF_3$. Reactive fluorocarbon fragments etch away the dielectric material at the bottom of a feature (e.g., cylinder) with the assistance of ions. Other fluorocarbon fragments are deposited on the sidewalls of the cylinder being etched, thereby forming a protective polymeric sidewall coating. This protective sidewall coating promotes preferential etching at the bottom of the feature as opposed to the sidewalls of the feature. Without this sidewall protection, the feature begins to assume a non-uniform profile, with a wider etch/cylinder width where the sidewall protection is inadequate.

Sidewall protection is especially difficult to achieve in high aspect ratio features. One reason for this difficulty is that existing fluorocarbon-based processes cannot form the protective polymeric sidewall coating deep in the cylinder being etched. FIG. 1 presents a figure of a cylinder 102 being etched in a dielectric material 103 coated with a patterned mask layer 106. While the following discussion sometimes refers to cylinders, the concepts apply to other feature shapes such as rectangles and other polygons. A protective polymeric sidewall coating 104 is concentrated near the top portion of the cylinder 102. $CH_xF_y$ chemistry provides both the etch reactant(s) for etching the cylinder vertically, as well as the reactant(s) that form the protective polymeric sidewall coating 104. Because the protective polymeric sidewall coating 104 does not extend deep into the cylinder (i.e., there is insufficient deposition on the sidewall), the middle portion of the cylinder 102 becomes wider than the top portion of the cylinder 102. The wider middle portion of the cylinder 102 is referred to as the bow 105. The bow can be numerically described in terms of a comparison between the critical dimension of the feature at the bow region and the critical dimension of the feature above the bow region (e.g., the neck region). The bow may be numerically reported in terms of distance (e.g., the critical dimension at the widest part of the feature minus the critical dimension at the narrowest part of the feature above the bow) or in terms of a ratio/percent (the critical dimension at the widest part of the feature divided by the critical dimension at the narrowest part of the feature above the bow). This bow 105, and the related non-uniform etch profile, is undesirable. Because of the high ion energies often used in this type of etching process, bows are often created when etching cylinders of high aspect ratios. In some applications, bows are created even at aspect ratios as low as about 5. As such, conventional fluorocarbon etch chemistry is typically limited to forming relatively low aspect ratio cylinders in dielectric materials. Some modern applications require cylinders having higher aspect ratios than those that can be achieved with conventional etch chemistry.

II. Context and Applications

In various embodiments herein, features are etched in a substrate (typically a semiconductor wafer) having dielectric material on the surface. The etching processes are generally plasma-based etching processes. The overall feature formation process may occur in stages: one stage directed at etching the dielectric material and another stage directed at forming a protective sidewall coating without substantially etching the dielectric material. The protective sidewall coating passivates the sidewalls and prevents the feature from being over-etched (i.e., the sidewall coating prevents lateral etch of the feature). These two stages can be repeated until the feature is etched to its final depth. By cycling these two stages, the diameter of the feature can be controlled over the entire depth of the feature, thereby forming features having more uniform diameters/improved profiles.

A feature is a recess in the surface of a substrate. Features can have many different shapes including, but not limited to, cylinders, rectangles, squares, other polygonal recesses, trenches, etc.

Aspect ratios are a comparison of the depth of a feature to the critical dimension of the feature (often its width/diameter). For example, a cylinder having a depth of 2 μm and a width of 50 nm has an aspect ratio of 40:1, often stated more simply as 40. Since the feature may have a non-uniform critical dimension over the depth of the feature, the aspect ratio can vary depending on where it is measured. For instance, sometimes an etched cylinder may have a middle portion that is wider than the top and bottom portions. This wider middle section may be referred to as the bow, as noted above. An aspect ratio measured based on the critical dimension at the top of the cylinder (i.e., the neck) would be higher than an aspect ratio measured based on the critical dimension at the wider middle/bow of the cylinder. As used herein, aspect ratios are measured based on the critical dimension proximate the opening of the feature, unless otherwise stated.

The features formed through the disclosed methods may be high aspect ratio features. In some applications, a high aspect ratio feature is one having an aspect ratio of at least about 5, at least about 10, at least about 20, at least about 30, at least about 40, at least about 50, at least about 60, at least about 80, or at least about 100. The critical dimension of the features formed through the disclosed methods may be about 200 nm or less, for example about 100 nm or less, about 50 nm or less, or about 20 nm or less.

The material into which the feature is etched may be a dielectric material in various cases. Example materials include, but are not limited to, silicon oxides, silicon nitrides, silicon carbides, oxynitrides, oxycarbides, carbonitrides, doped versions of these materials (e.g., doped with boron, phosphorus, etc.), and laminates from any combinations of these materials. Particular example materials include stoichiometric and non-stoichiometric formulations of $SiO_2$, SiN, SiON, SiOC, SiCN, etc.

One application for the disclosed methods is in the context of forming a DRAM device. In this case, the feature may be etched primarily in silicon oxide. The substrate may also include one, two, or more layers of silicon nitride, for instance. In one example, a substrate includes a silicon oxide layer sandwiched between two silicon nitride layers, with the silicon oxide layer being between about 800-1200 nm thick and one or more of the silicon nitride layers being between about 300-400 nm thick. The etched feature may be a cylinder having a final depth between about 1-3 μm, for example between about 1.5-2 μm. The cylinder may have a width between about 20-50 nm, for example between about 25-30 nm. After the cylinder is etched, a capacitor memory cell can be formed therein.

Another application for the disclosed methods is in the context of forming a vertical NAND (VNAND, also referred to as 3D NAND) device. In this case, the material into which the feature is etched may have a repeating layered structure. For instance, the material may include alternating layers of oxide (e.g., $SiO_2$) and nitride (e.g., SiN), or alternating layers of oxide (e.g., $SiO_2$) and polysilicon. The alternating layers form pairs of materials. In some cases, the number of pairs may be at least about 20, at least about 30, at least about 40, at least about 60, or at least about 70. The oxide layers may have a thickness between about 20-50 nm, for example between about 30-40 nm. The nitride or polysilicon layers may have a thickness between about 20-50 nm, for example between about 30-40 nm. The feature etched into the alternating layer may have a depth between about 2-6 μm, for example between about 3-5 μm. The feature may have a width between about 50-150 nm, for example between about 50-100 nm.

III. Etching/Deposition Process

Figure 2:
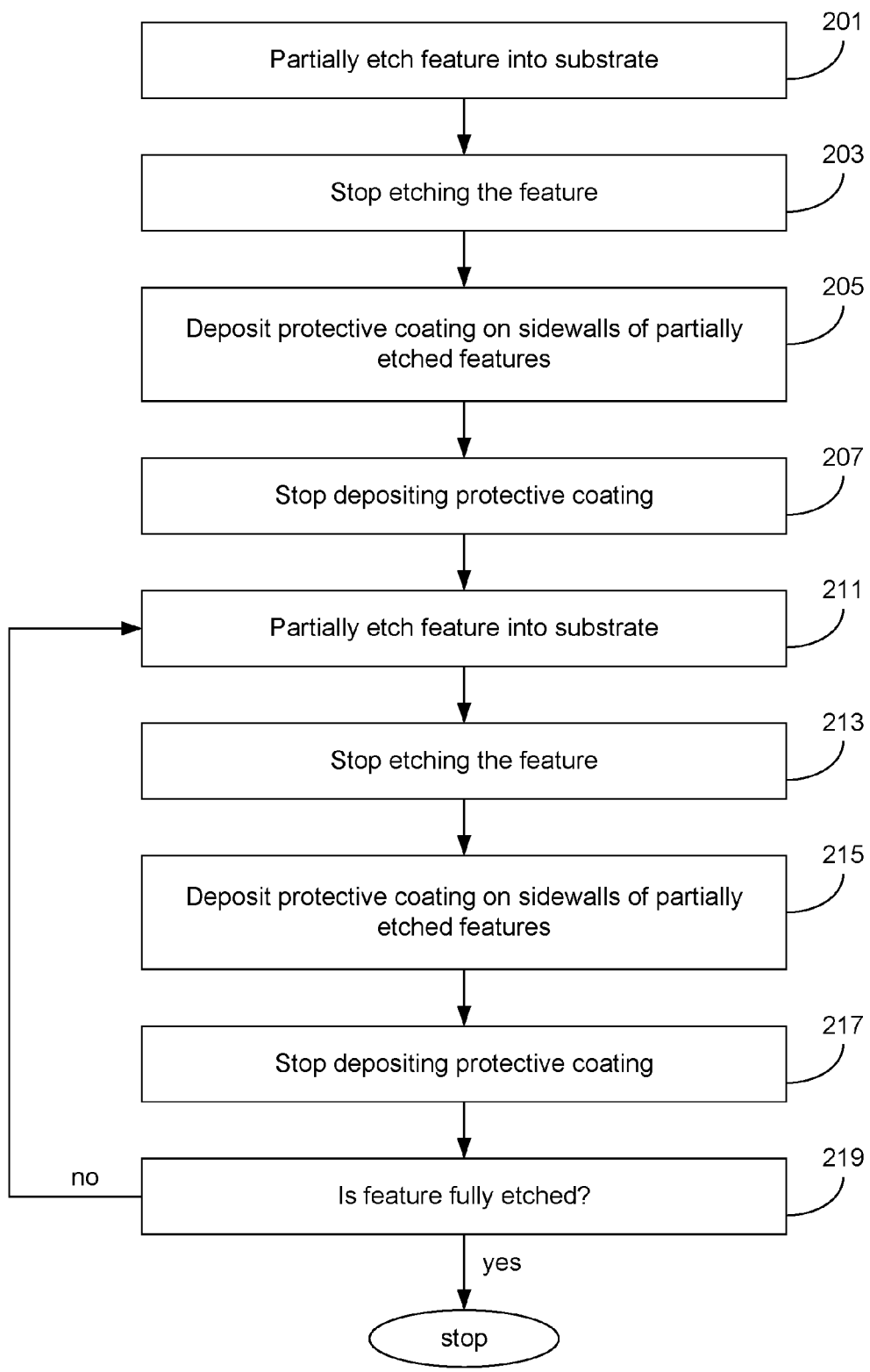
FIG. 2 presents a flowchart for a method of forming an etched feature on a semiconductor substrate according to various disclosed embodiments.

FIG. 2 presents a flowchart for a method of forming an etched feature in a semiconductor substrate. The operations shown in FIG. 2 are described in relation to FIGS. 3A-3D, which show a partially fabricated semiconductor substrate as the feature is etched. At operation 201, a feature 302 is etched to a first depth in a substrate having dielectric material 303 and a patterned mask layer 306. This first depth is only a fraction of the final desired depth of the feature. The chemistry used to etch the feature may be a fluorocarbon-based chemistry ($CH_xF_y$). Other etch chemistries may be used. This etching operation 201 may result in formation of a first sidewall coating 304. The first sidewall coating 304 may be a polymeric sidewall coating, as described with relation to FIG. 1. The first sidewall coating 304 extends toward the first depth, though in many cases the first sidewall coating 304 does not actually reach the bottom of the feature 302.

The first sidewall coating 304 indirectly forms from the $CH_xF_y$ etching chemistry as certain fluorocarbon species/fragments deposit on the sidewalls of the feature (i.e., certain fluorocarbon species are precursors for the first sidewall coating 304). One reason that the first sidewall coating 304 does not reach the bottom of the feature 302 may relate to the sticking coefficient of the precursors that form the coating. In particular, it is believed that for certain etchants the sticking coefficient of these first sidewall coating precursors is too high, which causes the substantial majority of the precursor molecules to attach to the sidewalls soon after entering the feature. As such, few sidewall coating precursor molecules are able to penetrate deep into the feature where sidewall protection is beneficial. The first sidewall coating 304 therefore provides only partial protection against overetching of the sidewalls of the feature 302. In some implementations, the etch conditions provide little if any sidewall protection.

Next, at operation 203 the etching process is stopped. After the etching is stopped, a second sidewall coating 310 is deposited in operation 205. In some cases, the second sidewall coating 310 may be effectively the first sidewall coating. This deposition may occur through various reaction mechanisms including, but not limited to, chemical vapor deposition (CVD) methods and atomic layer deposition (ALD) methods (either of which may be plasma-assisted). ALD methods are particularly well suited for forming conformal films that line the sidewalls of the features. For instance, ALD methods are useful for delivering reactants deep into features due to the adsorption-driven nature of such methods. While the embodiments herein are not limited to methods in which the second sidewall coating 310 is deposited through ALD, the method chosen to deposit the second sidewall coating 310 should allow for the protective layer to be formed deep in the etched feature 302. CVD and other deposition processes may be suitable in various implementations.

Figure 3A:
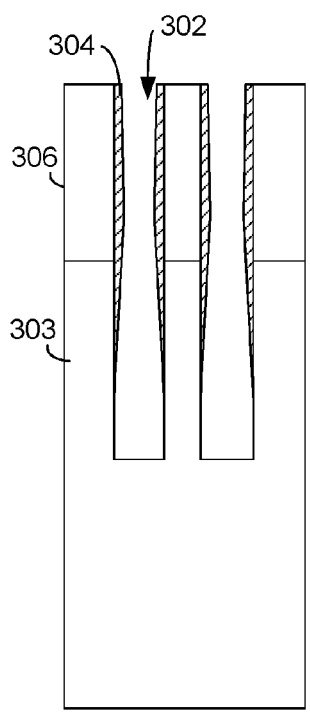
FIGS. 3A-3D depict etched cylinders in a semiconductor substrate as the cylinders are cyclically etched and coated with a protective sidewall coating according to various embodiments.
Figure 3B:
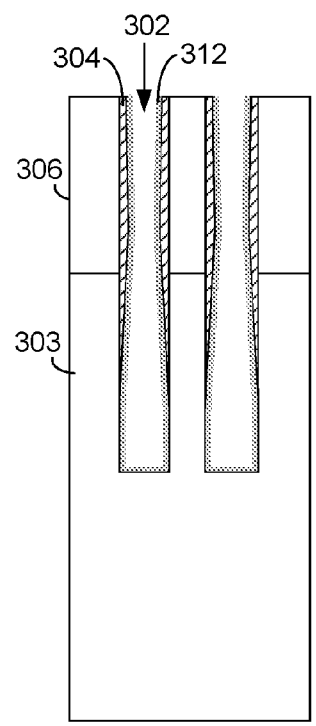
Figure 3C:
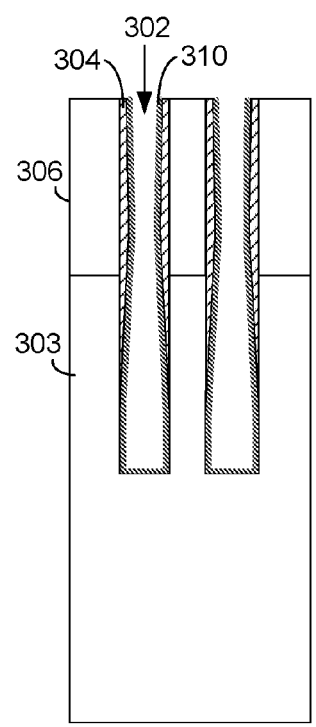

In certain embodiments, the second sidewall coating 310 is deposited using a reactant having a relatively low sticking coefficient (e.g., a silicon-containing reactant and/or a boron-containing reactant). The sticking coefficient should be low with respect to whatever species is present on the sidewalls at the time the reactant is delivered (e.g., the sticking coefficient may be low with respect to the native sidewalls and/or any species present on the sidewalls). Further, the sticking coefficient is that the coating species actually contact the sidewalls; such species may not be the reactant that enters the chamber. In one embodiment where the second sidewall coating 310 is deposited through ALD methods, the deposition in operation 205 includes (a) flowing a low sticking coefficient reactant into the reaction chamber and allowing the reactant to adsorb onto the surface of the substrate, thereby forming an adsorbed precursor layer 312; (b) optionally purging the reaction chamber (e.g., by sweeping with a purge gas, evacuating the reaction chamber, or both); (c) exposing the substrate to a plasma generated from an oxygen-containing and/or nitrogen-containing reactant (often provided with hydrogen, as well) to thereby drive a surface reaction to form a layer of the second sidewall coating 310 (this second sidewall coating 310 is typically an etch resistant film); (d) optionally purging the reaction chamber; and (e) repeating (a)-(d) to form additional layers of the second sidewall coating 310. The adsorbed precursor layer 312 is shown in FIG. 3B, and the second sidewall coating 310 is shown in FIG. 3C. The precursor adsorption (FIG. 3B) and film formation (FIG. 3C) may be cycled a number of times to form a film having a desired thickness.

Figure 3D:
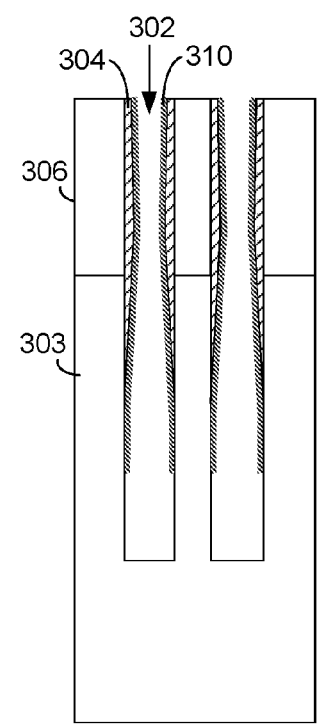

In another embodiment where the second sidewall coating 310 is deposited through CVD methods, the deposition may include flowing a low sticking coefficient reactant into the reaction chamber, optionally with a co-reactant (e.g., an oxygen-containing reactant and/or a nitrogen-containing reactant, optionally provided with hydrogen), while exposing the substrate to plasma. The plasma drives a gas phase reaction that results in deposition of the second sidewall coating 310. In this example, the method is represented by FIGS. 3A, 3C, and 3D (no adsorbed precursor layer 312 is formed, thus FIG. 3B is omitted).

Sticking coefficient is a term used to describe the ratio of the number of adsorbate species (e.g., atoms or molecules) that adsorb/stick to a surface compared to the total number of species that impinge upon that surface during the same period of time. The symbol $S_c$ is sometimes used to refer to the sticking coefficient. The value of $S_c$ is between 0 (meaning that none of the species stick) and 1 (meaning that all of the impinging species stick). Various factors affect the sticking coefficient including the type of impinging species, surface temperature, surface coverage, structural details of the surface, and the kinetic energy of the impinging species. Certain species are inherently more "sticky" than others, making them more likely to adsorb onto a surface each time the specie impinges on the surface. These more sticky species have greater sticking coefficients (all other factors being equal), and are more likely to adsorb near the entrance of a recessed feature compared to less sticky species having lower sticking coefficients. The fluorocarbon species such as those employed in conventional etch processes (and may form the first sidewall coating 304) have relatively high sticking coefficients, and therefore become concentrated near the top of the feature 302 where they first impinge upon the sidewalls. By comparison, species having lower sticking coefficients, even if they impinge upon the surface near the top of the sidewalls, are less likely to adsorb during each impact, and therefore have a greater probability of reaching the bottom portion of the feature 302.

In certain embodiments, silicon-containing reactants and boron-containing reactants are used to form the second sidewall coating 310 and have lower sticking coefficients than the fluorocarbon species that form the first sidewall coating 304. As such, these reactants are suited to forming a protective coating that reaches to the bottom of an etched feature. Further, adsorption-based ALD methods are particularly suited for forming a second sidewall coating that reaches the bottom of an etched feature because the reactant can be delivered until it substantially coats the entire sidewalls of the feature. The reactant does not build up near the top of the feature since only a monolayer of reactant typically adsorbs onto the surface during each cycle.

Returning to FIG. 2, the method continues at operation 207 where the deposition process is stopped. The method then repeats the operations of partially etching a feature in the substrate (operation 211, analogous to operation 201), stopping the etch (operation 213, analogous to operation 203), depositing protective coating on sidewalls of the partially etched features (operation 215, analogous to operation 205), and stopping the deposition (operation 217, analogous to operation 207). Next, at operation 219, it is determined whether the feature is fully etched. If the feature is not fully etched, the method repeats from operation 211 with additional etching and deposition of protective coatings. The etching operation 211 may alter the second sidewall coating 310 to form a film that is even more etch resistant than the film deposited in operations 205 and 215. In one example, the deposition operation 205 forms a layer of boron nitride (for example by alternatively cycling $BCl_3$ and $N_2+H_2$ and exposing to plasma), and the etching operation 211 reacts the boron nitride film to form boron oxide (e.g., using chemistry having a combination of fluorocarbon(s) and oxygen). Once the feature is fully etched, the method is complete.

In various embodiments, the etching operation 201 and the protective sidewall coating deposition operation 205 are cyclically repeated a number of times. For instance, these operations may each occur at least twice (as shown in FIG.

2), for example at least about three times, or at least about 5 times. In some cases, the number of cycles (each cycle including etching operation 201 and protective sidewall coating deposition operation 205, with etching operation 211 and deposition operation 215 counting as a second cycle) is between about 2-10, for example between about 2-5. Each time the etching operation occurs, the etch depth increases. The distance etched may be uniform between cycles, or it may be non-uniform. In certain embodiments, the distance etched in each cycle decreases as additional etches are performed (i.e., later performed etching operations may etch less extensively than earlier performed etching operations). The thickness of the second sidewall coating 310 deposited in each deposition operation 205 may be uniform between cycles, or the thickness of such coatings may vary. Example thicknesses for the second sidewall coating 310 during each cycle may range between about 1-10 nm, for example between about 3-5 nm. Further, the type of coating that is formed may be uniform between the cycles, or it may vary. In one example, a boron nitride sidewall coating is formed during a first cycle of operation 205, and a boron oxide sidewall coating is formed during a second cycle of operation 205.

The etching operation 201 and the deposition operation 205 may occur in the same reaction chamber or in different reaction chambers. In one example, the etching operation 201 occurs in a first reaction chamber and the deposition operation 205 occurs in a second reaction chamber, with the first and second reaction chambers together forming a multi-chamber processing apparatus such as a cluster tool. Load-locks and other appropriate vacuum seals may be provided for transferring the substrate between the relevant chambers in certain cases. The substrate may be transferred by a robot arm or other mechanical structure. A reaction chamber used for etching may be a Flex™ reaction chamber, for example from the 2300® Flex™ product family available from Lam Research Corporation of Fremont, Calif. A reaction chamber used for deposition may be chamber from the Vector® product family or the Altus® product family, both available from Lam Research Corporation. The use of a combined reactor for both etching and deposition may be beneficial in certain embodiments as the need to transfer the substrate is avoided. The use of different reactors for etching and deposition may be beneficial in other embodiments where it is desired that the reactors are particularly optimized for each operation. The relevant reaction chambers are discussed further below.

As noted, the deposition operation helps optimize the etching operation by forming a deeply penetrating protective layer that minimizes or prevents lateral etch of the feature during the etching operation. This promotes formation of etched features having very vertical sidewalls with little or no bowing. In certain implementations, a final etched feature having an aspect ratio of at least about 80 has a bow less than about 60% (measured as the widest critical dimension-narrowest critical dimension above that/narrowest critical dimension above that*100). For example, a feature having a widest CD of 50 nm and a narrowest CD of 40 nm (the 40 nm CD being positioned above the 50 nm CD in the feature) has a bow of 25% (100*(50 nm-40 nm)/40 nm=25%). In another implementation, a final etched feature having an aspect ratio of at least about 40 has a bow less than about 20%.

IV. Materials and Parameters of the Process Operations

A. Substrate

The methods disclosed herein are particularly useful for etching semiconductor substrates having dielectric materials thereon. Example dielectric materials include silicon oxides, silicon nitrides, silicon carbides, oxynitrides, oxycarbides, carbo-nitrides, doped versions of these materials (e.g., doped with boron, phosphorus, etc.), and laminates from any combinations of these materials. Particular example materials include stoichiometric and non-stoichiometric formulations of $SiO_2$, SiN, SiON, SiOC, SiCN, etc. As noted above, the dielectric material that is etched may include more than one type/layer of material. In particular cases, the dielectric material may be provided in alternating layers of SiN and $SiO_2$ or alternating layers of polysilicon and $SiO_2$. Further details are provided above. The substrate may have an overlying mask layer that defines where the features are to be etched. In certain cases, the mask layer is Si, and it may have a thickness between about 500-1500 nm.

B. Etching Process

In various embodiments, the etching process is a reactive ion etch process that involves flowing a chemical etchant into a reaction chamber (often through a showerhead), generating a plasma from, inter alia, the etchant, and exposing a substrate to the plasma. The plasma dissociates the etchant compound(s) into neutral species and ion species (e.g., charged or neutral materials such as CF, $CF_2$ and $CF_3$). The plasma is a capacitively coupled plasma in many cases, though other types of plasma may be used as appropriate. Ions in the plasma are directed toward the wafer and cause the dielectric material to be etched away upon impact.

Example apparatus that may be used to perform the etching process include the 2300® FLEX™ product family of reactive ion etch reactors available from Lam Research Corporation of Fremont, Calif. This type of etch reactor is further described in the following U.S. patents, each of which is herein incorporated by reference in its entirety: U.S. Pat. No. 8,552,334, and U.S. Pat. No. 6,841,943.

Various reactant options are available to etch the features into the dielectric material. In certain cases, the etching chemistry includes one or more fluorocarbons. In these or other cases, the etching chemistry may include other etchants such as $NF_3$. One or more co-reactants may also be provided. In some cases oxygen ($O_2$) is provided as a co-reactant. The oxygen may help moderate formation of a protective polymer sidewall coating (e.g., the first sidewall coating 304 of FIGS. 3A-3D).

In certain implementations, the etching chemistry includes a combination of fluorocarbons and oxygen. For instance, in one example the etching chemistry includes $C_4F_6$, $C_4F_8$, $N_2$, CO, $CF_4$, and $O_2$. Other conventional etching chemistries may also be used, as may non-conventional chemistries. The fluorocarbons may flow at a rate between about 0-500 sccm, for example between about 10-200 sccm. Where $C_4F_6$ and $C_4F_8$ are used, the flow of $C_4F_6$ may range between about 10-200 sccm and the flow of $C_4F_8$ may range between about 10-200 sccm. The flow of oxygen may range between about 0-500 sccm, for example between about 10-200 sccm. The flow of nitrogen may range between about 0-500 sccm, for example between about 10-200 sccm. The flow of tetrafluoromethane may range between about 0-500 sccm, for example between about 10-200 sccm. The flow of carbon monoxide may range between about 0-500 sccm, for example between about 10-200 sccm. These rates are appropriate in a reactor volume of approximately 50 liters.

In some embodiments, the substrate temperature during etching is between about 0-100° C. In some embodiments, the pressure during etching is between about 10-50 mTorr.

The ion energy may be relatively high, for example between about 1-10 kV. The ion energy is determined by the applied RF power. In various cases, dual-frequency RF power is used to generate the plasma. Thus, the RF power may include a first frequency component (e.g., about 2 MHz) and a second frequency component (e.g., about 60 MHz). Different powers may be provided at each frequency component. For instance, the first frequency component (e.g., about 2 MHz) may be provided at a power between about 3-6 kW, for example about 5 kW, and the second frequency component (e.g., about 60 MHz) may be provided at a lower power, for example between about 0.5-2 kW, for example about 1 kW. These power levels assume that the RF power is delivered to a single 300 mm wafer. The power levels can be scaled linearly based on substrate area for additional substrates and/or substrates of other sizes (thereby maintaining a uniform power density delivered to the substrate).

Each cycle of the etching process etches the dielectric material to some degree. The distance etched during each cycle may be between about 10-500 nm, for example between about 50-200 nm. The total etch depth will depend on the particular application. For some cases (e.g., DRAM) the total etch depth may be between about 1.5-2 µm. For other cases (e.g., VNAND) the total etch depth may be at least about 3 µm, for example at least about 4 µm. In these or other cases, the total etch depth may be about 5 µm or less.

As explained in the discussion of FIGS. 3A-3D, the etching process can produce a first sidewall coating (e.g., first sidewall coating 304, which may be polymeric). However, the depth of this sidewall coating may limited to the area near the upper portion of the feature, and may not extend all the way down into the feature where the sidewall protection is also needed. Thus, a separate deposition operation is performed, as described herein, to form a sidewall coating that covers substantially the entire depth of the etched feature.

In some processes, the operation of depositing the protective sidewall coating (e.g., the second sidewall coating 310 in FIGS. 3C and 3D) results in the deposition of a first type of film, and the etching operation alters this first type of film to form a second type of film. The second type of film may be more etch resistant than the first type of film. For instance, the deposition operation may involve formation of a boron nitride (BN) film, which is then processed into a boron oxide (BO) film during the etch operation. The inclusion of oxygen in the etch chemistry may at least partially drive this change. The boron oxide film may be particularly resistant to etching, thereby providing very good protection against over-etching the sidewalls.

C. Deposition Process

The deposition process is performed primarily to deposit a protective layer on the sidewalls within the etched features. This protective layer should extend deep into the feature, even in high aspect ratio features. Formation of the protective layer deep within high aspect ratio features may be enabled by reactants that have relatively low sticking coefficients. Further, reaction mechanisms that rely on adsorption-limited deposition (e.g., ALD reactions) can promote formation of the protective layer deep within the etched features. Deposition of the protective layer begins after the feature is partially etched. As noted in the discussion of FIG. 2, the deposition operation may be cycled with the etching operation to form additional sidewall protection as the feature is etched deeper into the dielectric material. In some cases, deposition of the protective layer begins at or after the feature is etched to at least about ⅓ of its final depth. In some embodiments, deposition of the protective layer begins once the feature reaches an aspect ratio of at least about 2, at least about 5, at least about 10, at least about 15, at least about 20, or at least about 30. In these or other cases, the deposition may begin before the feature reaches an aspect ratio of about 4, about 10, about 15, about 20, about 30, about 40, or about 50. In some embodiments, deposition begins after the feature is at least about 1 µm deep, or at least about 1.5 µm deep (e.g., in VNAND embodiments where the final feature depth is 3-4 µm). In other embodiments, deposition begins after the feature is at least about 600 nm deep, or at least about 800 nm deep (e.g., in DRAM embodiments where the final feature depth is 1.5-2 µm deep). The optimal time for initiating deposition of the protective layer is immediately before the sidewalls would otherwise become overetched to form a bow. The exact timing of this occurrence depends on the shape of the feature being etched, the material being etched, the chemistry used to etch and to deposit the protective layer, and the process conditions used to etch and deposit the relevant materials.

The protective layer that forms during the deposition process may have various compositions. As explained, the protective layer should penetrate deep into an etched feature, and should be relatively resistant to the etching chemistry used to etch the feature. In some cases the protective layer is a ceramic material or an organic polymer. Example inorganic materials may include, but are not limited to, boron-containing materials such as stoichiometric or non-stoichiometric formulations of boron oxides ($B_xO_y$) and boron nitrides ($B_xN_y$). Other examples include stoichiometric or non-stoichiometric formulations of silicon-containing materials such as silicon oxides ($Si_xO_y$) and silicon nitrides ($Si_xN_y$). Example organic materials may include polyolefins, for example polyfluoroolefins in some cases. One particular example is a polytetrafluoroethylene. A precursor fragment used for forming some polyfluoroolefins is $CF_2$ (which may come from hexafluoropropylene oxide (HFPO) in certain cases), which has a very low sticking coefficient and is therefore good at penetrating deep into an etched feature. Other examples may include stoichiometric and non-stoichiometric formulations of boron carbides or silicon carbides. In further embodiments, the protective layer that forms during the deposition process may be a metal oxide, metal nitride, or metal carbide.

Where the protective layer includes boron, a boron-containing reactant may be used. Example boron-containing reactants include, but are not limited to, triisopropyl borate ($[(CH_3)_2CHO]_3B$), trimethylboron-$d_9$ ($B(CD_3)_3$), triphenylborane (($C_6H_5)_3B$), and tris(pentafluorophenyl)borane (($C_6F_5)_3B$). Other examples of boron-containing reactants include boron trichloride ($BCl_3$), borane ($BH_3$), diborane ($B_2H_6$), boron trifluoride ($BF_3$), and trimethyl borate ($B(OCH_3)_3$). In a particular example, a boron-containing reactant is selected from the group consisting of: $B_2H_6$, $BCl_3$, $BF_3$, and combinations thereof. Cyclic ALD or ALD-like deposition reactions may deposit the boron-containing protective layer. Alternatively, non-cyclic processes such as bulk CVD deposition may deposit the boron-containing protective layer.

Where the protective layer includes silicon, a silicon-containing reactant may be used. A silicon-containing reactant may be, for example, a silane, a halosilane or an aminosilane. A silane contains hydrogen and/or carbon groups, but does not contain a halogen. Examples of silanes are silane ($SiH_4$), disilane ($Si_2H_6$), and organo silanes such as methylsilane, ethylsilane, isopropylsilane, t-butylsilane, dimethylsilane, diethyl silane, di-t-butylsilane, allylsilane, sec-butylsilane, thexylsilane, isoamylsilane, t-butyldisilane, di-t-butyldisilane, and the like. A halosilane contains at least one halogen group and may or may not contain hydrogens and/or carbon groups. Examples of halosilanes are iodosilanes, bromosilanes, chlorosilanes and fluorosilanes. Although halosilanes, particularly fluorosilanes, may form reactive halide species that can etch silicon materials, in certain embodiments described herein, the silicon-containing reactant is not present when a plasma is struck. Specific chlorosilanes are tetrachlorosilane ($SiCl_4$), trichlorosilane ($HSiCl_3$), dichlorosilane ($H_2SiCl_2$), monochlorosilane (Cl-$SiH_3$), chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like. One specific bromosilane is $SiBr_4$. An aminosilane includes at least one nitrogen atom bonded to a silicon atom, but may also contain hydrogens, oxygens, halogens and carbons. Examples of aminosilanes are mono-, di-, tri- and tetra-aminosilane ($H_3Si(NH_2)_4$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tertiarybutylamino)silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$ and the like. A further example of an aminosilane is trisilylamine ($N(SiH_3)_3$). In a particular example, a silicon-containing reactant is selected from the group consisting of $SiCl_4$, $SiH_4$, $SiF_4$, $SiBr_4$, and combinations thereof. Cyclic ALD or ALD-like deposition reactions may deposit the silicon-containing protective layer. Alternatively, non-cyclic processes such as bulk CVD deposition may deposit the silicon-containing protective layer. In certain embodiments, the silicon containing precursor is reacted with an oxidant such nitrous oxide and/or molecular oxygen to produce a silicon oxide protective coating.

Where the protective film includes nitrogen—e.g., a silicon nitride, a silicon oxynitride, or a boron nitride—a nitrogen-containing reactant may be used. A nitrogen-containing reactant contains at least one nitrogen, for example, nitrogen, ammonia, hydrazine, amines (e.g., amines bearing carbon) such as methylamine, dimethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzylamines. Amines may be primary, secondary, tertiary or quaternary (for example, tetraalkylammonium compounds). A nitrogen-containing reactant can contain heteroatoms other than nitrogen, for example, hydroxylamine, t-butyloxycarbonyl amine and N-t-butyl hydroxylamine are nitrogen-containing reactants. Another example is nitrous oxide.

Where the protective film includes oxygen—e.g., a silicon oxide, a boron oxide, or a metal oxide—an oxygen-containing reactant may be used. Examples of oxygen-containing reactants include, but are not limited to, oxygen, ozone, nitrous oxide, nitric oxide, nitrogen dioxide, carbon monoxide, carbon dioxide, sulfur oxide, sulfur dioxide, oxygen-containing hydrocarbons ($C_xH_yO_z$), water, mixtures thereof, etc. The disclosed precursors are not intended to be limiting.

When the protective coating contains an organic polymer, a low sticking coefficient precursor is used. Examples of such precursors include those that produce $CF_2$ fragments.

Other reactants may also be used as known by those of ordinary skill in the art. For example where the protective film includes a metal, a metal-containing reactant may be used, and where the protective film includes carbon, a carbon-containing reactant may be used.

A few particular examples of reactant combinations will be provided, though these examples are not intended to be limiting. In one example, a boron-containing precursor film is formed by adsorbing a boron-containing reactant such as $B_2H_6$, $BCl_3$ or $BF_3$ to the substrate surface. The precursor film is converted to a protective film through exposure to an oxidizing or nitridizing plasma (e.g., the plasma being generated from $O_2$, $N_2$, $NH_3$, $N_2O$, $H_2$, and combinations thereof).

In a particular example, $BCl_3$ is adsorbed to form the boron-containing precursor layer, and then a plasma is generated from a combination of $N_2$ and $H_2$, which drives formation of a boron nitride protective film. The reaction may occur through a cyclic process such as ALD. In a similar example, the reaction may occur through a continuous process such as CVD, where the $BCl_3$, $N_2$ and $H_2$ are all provided concurrently while the substrate is exposed to plasma. After formation of the boron nitride film, the substrate may be further etched. The etching chemistry may include oxygen (along with other etching chemistry, e.g., fluorocarbons such as $C_4F_6$ and/or $C_4F_8$), which can react with the boron nitride film to form boron oxide. The boron oxide is particularly resistant to the fluorocarbon-based etch chemistry, thereby providing good protection against over-etching the sidewalls.

In another example, a silicon containing species (e.g., SiCl4, SiH4, SiF4, SiBr4, etc.) is adsorbed onto the surface of the substrate to form a silicon-containing precursor film. The silicon-containing precursor film may be converted to silicon oxide or silicon nitride by exposing it to a plasma generated from $O_2$, $N_2$, $NH_3$, $N_2O$, $H_2$, and combinations thereof. If the dielectric material being etched includes silicon oxide, it may be preferable to form the protective layer as a silicon nitride (and vice versa).

As noted above, the precursor(s) used to form the protective layer may have relatively low sticking coefficients, thereby enabling the precursors to penetrate deep into the etched features. In some cases, the sticking coefficient of the precursors (at the relevant deposition conditions) may be about 0.05 or less, for example about 0.001 or less.

The reaction mechanism may be cyclic (e.g., ALD) or continuous (e.g., CVD). Any method that results in the formation of the protective sidewall film at high aspect ratios may be used. As mentioned, ALD reactions may be particularly well suited for this purpose due to their conformality and adsorption-limited properties. However, other types reactions may be used so long as the film is able to form at high aspect ratios to protect the sidewalls deep in an etched feature. The basic operations for ALD and CVD reactions are described above in relation to operation 205 of FIG. 2. Briefly, plasma assisted ALD reactions involve cyclically performing the following operations: (a) delivery of a first reactant to form an adsorbed precursor layer, (b) an optional purge operation to remove the first reactant from the reaction chamber, (c) delivery of a second reactant, often provided in the form of a plasma, (d) optional purge to remove excess reactant, and (e) repeating (a)-(d) until the film reaches a desired thickness. Because the reactants are provided at separate times and the reaction is a surface reaction, the film is adsorption limited. This results in the formation of very conformal films that can line entire recessed features. By contrast, plasma assisted CVD reactions involve delivering reactant(s) to the substrate continuously while the substrate is exposed to plasma. CVD reactions are gas phase reactions, which deposit reaction products on the substrate surface.

The following reaction conditions may be used in certain embodiments where the deposition reaction occurs through ALD methods. The substrate temperature may be maintained between about 0-500° C., for example between about 20-200° C. The pressure may be maintained as low as about 100 or 200 mTorr and as high as about 1, 2, or 3 Torr. The ion energy may be relatively low, for example below about 1 kV. The RF frequency used to generate the plasma may be about 60 MHz, though other frequencies may also be used. The RF power may be a few hundred Watts, for example about 500 W or less, about 400 W or less, or about 300 W or less (assuming the power is delivered to a single 300 mm wafer, the power scaling linearly based on substrate area for additional or differently sized substrates). During each ALD cycle, the adsorbing reactant may be delivered for a duration between about 0.5-20 seconds, at a flow rate between about 50-1000 sccm. The first purge may have a duration between about 0-60 seconds. The plasma may be exposed to the substrate for a duration between about 0.5-120 seconds, with a flow rate of a reactant (excluding any inert gas provided along with the reactant) between about 50-1000 sccm. A flow rate of hydrogen during the plasma exposure may be between about 0-1000 sccm. The post-RF purge may have a duration between about 0-60 seconds.

The following reaction conditions may be used in certain embodiments where the deposition reaction occurs through CVD methods. The substrate temperature may be maintained between about 0-500° C., for example between about 20-200° C. The pressure may be maintained between about 100-3000 mT. The RF frequency used to generate the plasma may be 2-60 MHz. The RF power used to generate the plasma may be between about 50-2000 W, for example between about 100-800 W (assuming a single 300 mm substrate). The duration of the reactant delivery and plasma exposure may be between about 1-180 seconds. The flow rates depend on the particular reactants. In one example, $BCl_3$, $N_2$ and $H_2$ are provided, with $BCl_3$ provided at a flow rate between about 50-1000 sccm, $N_2$ at a rate between about 50-1000 sccm, and $H_2$ at a rate between about 50-1000 sccm. The ALD and CVD reaction conditions are provided as guidance and are not intended to be limiting.

V. Apparatus

The methods described herein may be performed by any suitable apparatus or combination of apparatus. A suitable apparatus includes hardware for accomplishing the process operations and a system controller having instructions for controlling process operations in accordance with the present invention. For example, in some embodiments, the hardware may include one or more process stations included in a process tool. One process station may be an etching station and another process station may be a deposition station. In another embodiment, etching and deposition occur in a single station/chamber.

Figure 4A:
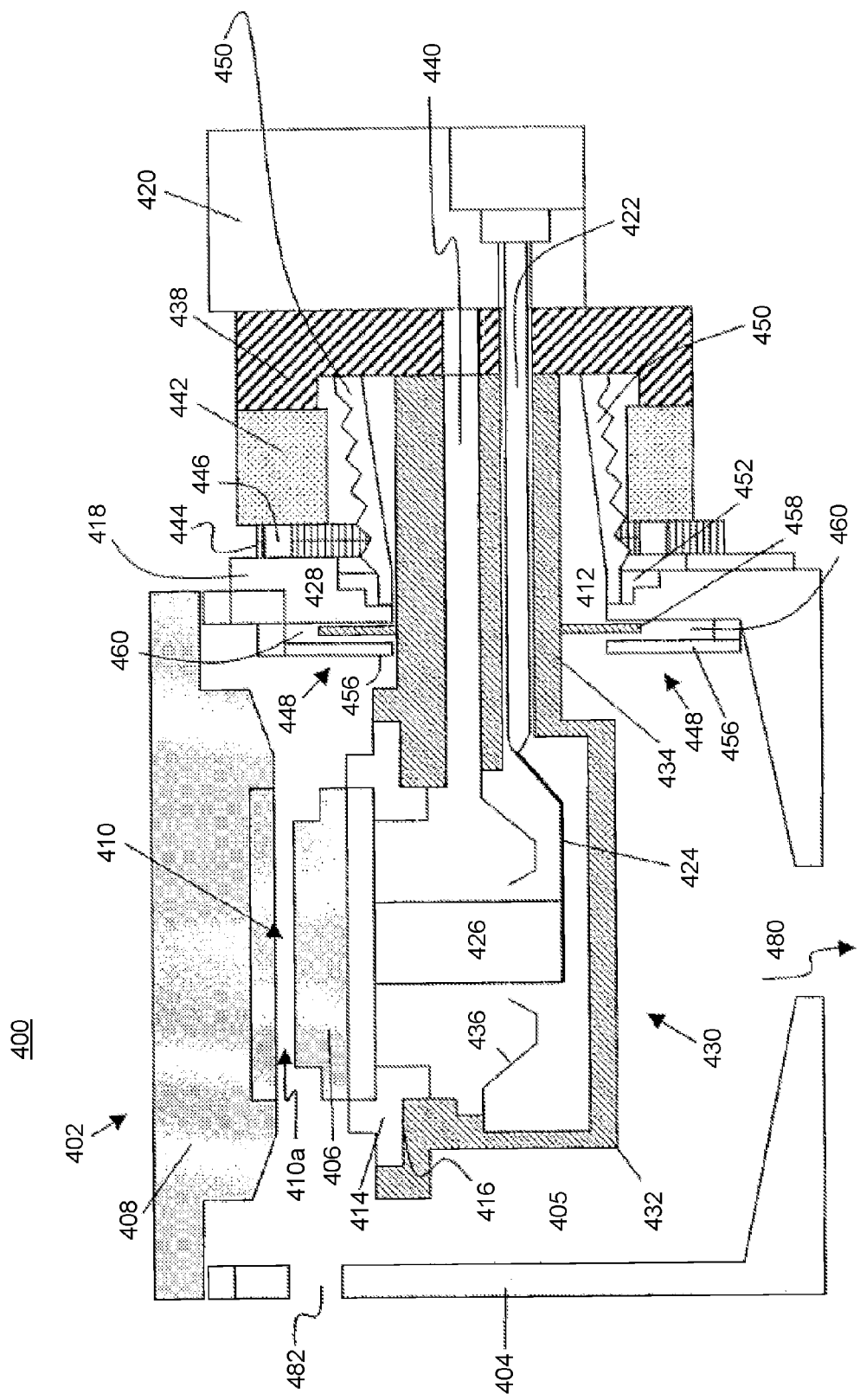
FIGS. 4A-4C illustrate a reaction chamber that may be used to perform the etching processes described herein according to certain embodiments.
Figure 4B:
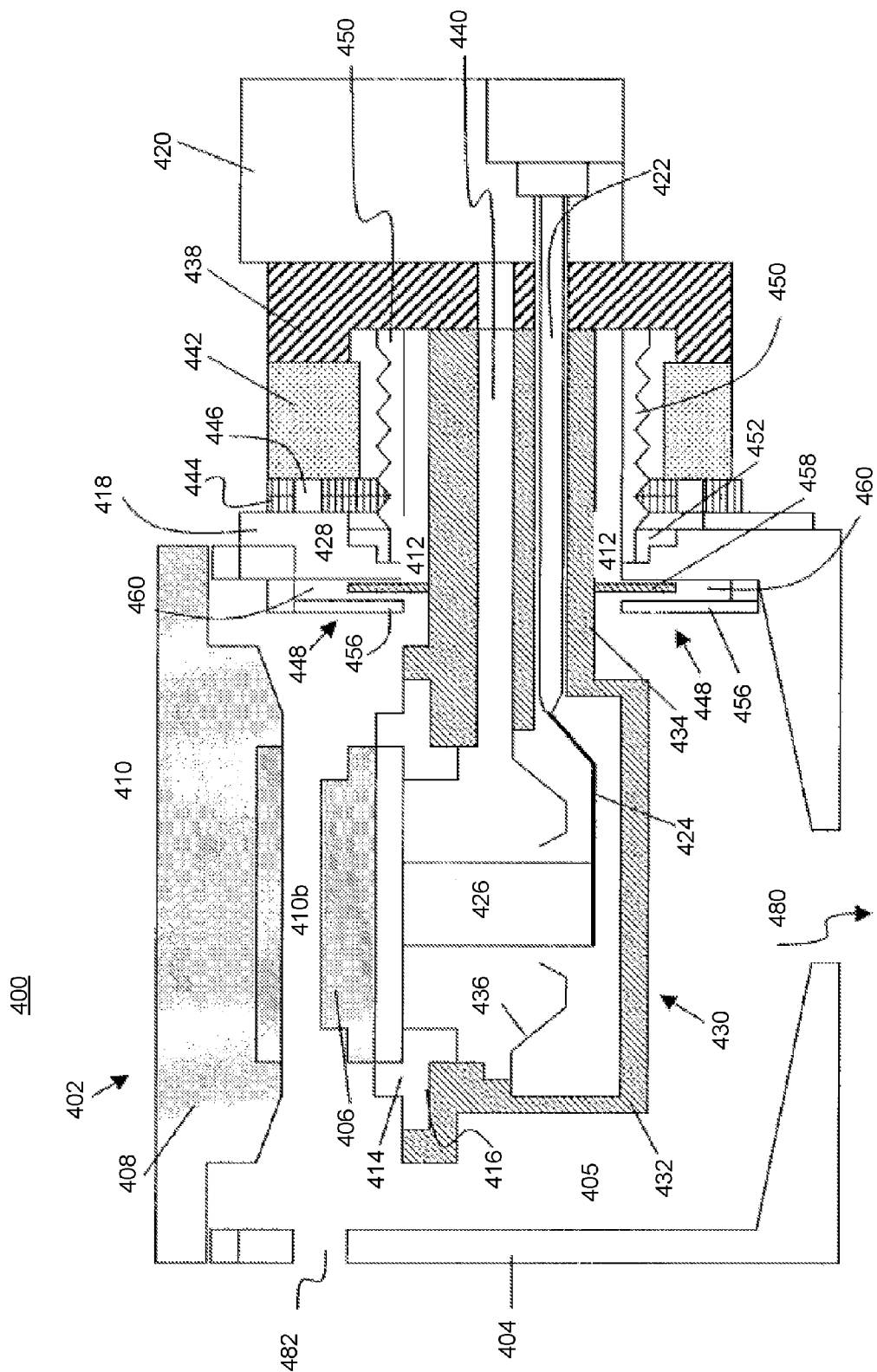
Figure 4C:
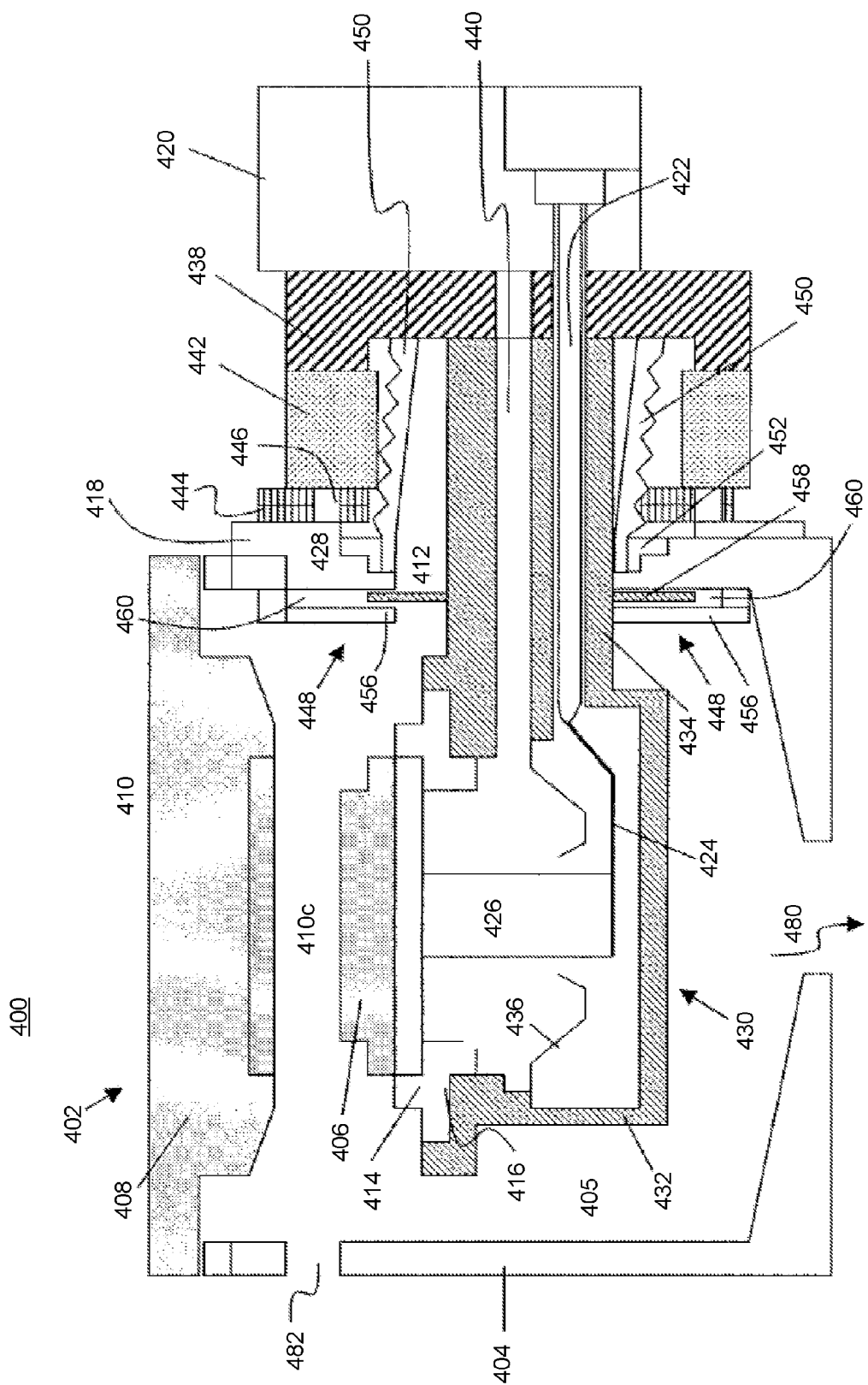

FIGS. 4A-4C illustrate an embodiment of an adjustable gap capacitively coupled confined RF plasma reactor 400 that may be used for performing the etching operations described herein. As depicted, a vacuum chamber 402 includes a chamber housing 404, surrounding an interior space housing a lower electrode 406. In an upper portion of the chamber 402 an upper electrode 408 is vertically spaced apart from the lower electrode 406. Planar surfaces of the upper and lower electrodes 408, 406 are substantially parallel and orthoganol to the vertical direction between the electrodes. Preferably the upper and lower electrodes 408, 406 are circular and coaxial with respect to a vertical axis. A lower surface of the upper electrode 408 faces an upper surface of the lower electrode 406. The spaced apart facing electrode surfaces define an adjustable gap 410 therebetween. During operation, the lower electrode 406 is supplied RF power by an RF power supply (match) 420. RF power is supplied to the lower electrode 406 though an RF supply conduit 422, an RF strap 424 and an RF power member 426. A grounding shield 436 may surround the RF power member 426 to provide a more uniform RF field to the lower electrode 406. As described in commonly-owned U.S. Pat. No. 7,732,728, the entire contents of which are herein incorporated by reference, a wafer is inserted through wafer port 482 and supported in the gap 410 on the lower electrode 406 for processing, a process gas is supplied to the gap 410 and excited into plasma state by the RF power. The upper electrode 408 can be powered or grounded.

In the embodiment shown in FIGS. 4A-4C, the lower electrode 406 is supported on a lower electrode support plate 416. An insulator ring 414 interposed between the lower electrode 406 and the lower electrode Support plate 416 insulates the lower electrode 406 from the support plate 416.

An RF bias housing 430 supports the lower electrode 406 on an RF bias housing bowl 432. The bowl 432 is connected through an opening in a chamber wall plate 418 to a conduit support plate 438 by an arm 434 of the RF bias housing 430. In a preferred embodiment, the RF bias housing bowl 432 and RF bias housing arm 434 are integrally formed as one component, however, the arm 434 and bowl 432 can also be two separate components bolted or joined together.

The RF bias housing arm 434 includes one or more hollow passages for passing RF power and facilities, such as gas coolant, liquid coolant, RF energy, cables for lift pin control, electrical monitoring and actuating signals from outside the vacuum chamber 402 to inside the vacuum chamber 402 at a space on the backside of the lower electrode 406. The RF supply conduit 422 is insulated from the RF bias housing arm 434, the RF bias housing arm 434 providing a return path for RF power to the RF power supply 420. A facilities conduit 440 provides a passageway for facility components. Further details of the facility components are described in U.S. Pat. Nos. 5,948,704 and 7,732,728 and are not shown here for simplicity of description. The gap 410 is preferably surrounded by a confinement ring assembly or shroud (not shown), details of which can be found in commonly owned published U.S. Pat. No. 7,740,736 herein incorporated by reference. The interior of the vacuum chamber 402 is maintained at a low pressure by connection to a vacuum pump through vacuum portal 480.

The conduit support plate 438 is attached to an actuation mechanism 442. Details of an actuation mechanism are described in commonly-owned U.S. Pat. No. 7,732,728 incorporated herein by above. The actuation mechanism 442, such as a servo mechanical motor, stepper motor or the like is attached to a vertical linear bearing 444, for example, by a screw gear 446 such as a ball screw and motor for rotating the ball screw. During operation to adjust the size of the gap 410, the actuation mechanism 442 travels along the vertical linear bearing 444. FIG. 4A illustrates the arrangement when the actuation mechanism 442 is at a high position on the linear bearing 444 resulting in a small gap 410 a. FIG. 4B illustrates the arrangement when the actuation mechanism 442 is at a mid position on the linear bearing 444. As shown, the lower electrode 406, the RF bias housing 430, the conduit support plate 438, the RF power supply 420 have all moved lower with respect to the chamber housing 404 and the upper electrode 408, resulting in a medium size gap 410 b.

FIG. 4C illustrates a large gap 410 c when the actuation mechanism 442 is at a low position on the linear bearing. Preferably, the upper and lower electrodes 408, 406 remain coaxial during the gap adjustment and the facing surfaces of the upper and lower electrodes across the gap remain parallel.

This embodiment allows the gap 410 between the lower and upper electrodes 406, 408 in the CCP chamber 402 during multi-step process recipes (BARC, HARC, and STRIP etc.) to be adjusted, for example, in order to maintain uniform etch across a large diameter substrate such as 300 mm wafers or flat panel displays. In particular, this chamber pertains to a mechanical arrangement that permits the linear motion necessary to provide the adjustable gap between lower and upper electrodes 406, 408.

FIG. 4A illustrates laterally deflected bellows 450 sealed at a proximate end to the conduit support plate 438 and at a distal end to a stepped flange 428 of chamber wall plate 418. The inner diameter of the stepped flange defines an opening 412 in the chamber wall plate 418 through which the RF bias housing arm 434 passes. The distal end of the bellows 450 is clamped by a clamp ring 452.

The laterally deflected bellows 450 provides a vacuum seal while allowing vertical movement of the RF bias housing 430, conduit support plate 438 and actuation mechanism 442. The RF bias housing 430, conduit support plate 438 and actuation mechanism 442 can be referred to as a cantilever assembly. Preferably, the RF power supply 420 moves with the cantilever assembly and can be attached to the conduit support plate 438. FIG. 4B shows the bellows 450 in a neutral position when the cantilever assembly is at a mid position. FIG. 4C shows the bellows 450 laterally deflected when the cantilever assembly is at a low position.

A labyrinth seal 448 provides a particle barrier between the bellows 450 and the interior of the plasma processing chamber housing 404. A fixed shield 456 is immovably attached to the inside inner wall of the chamber housing 404 at the chamber wall plate 418 so as to provide a labyrinth groove 460 (slot) in which a movable shield plate 458 moves vertically to accommodate vertical movement of the cantilever assembly. The outer portion of the movable shield plate 458 remains in the slot at all vertical positions of the lower electrode 406.

In the embodiment shown, the labyrinth seal 448 includes a fixed shield 456 attached to an inner surface of the chamber wall plate 418 at a periphery of the opening 412 in the chamber wall plate 418 defining a labyrinth groove 460. The movable shield plate 458 is attached and extends radially from the RF bias housing arm 434 where the arm 434 passes through the opening 412 in the chamber wall plate 418. The movable shield plate 458 extends into the labyrinth groove 460 while spaced apart from the fixed shield 456 by a first gap and spaced apart from the interior surface of the chamber wall plate 418 by a second gap allowing the cantilevered assembly to move vertically. The labyrinth seal 448 blocks migration of particles spalled from the bellows 450 from entering the vacuum chamber interior 405 and blocks radicals from process gas plasma from migrating to the bellows 450 where the radicals can form deposits which are subsequently spalled.

FIG. 4A shows the movable shield plate 458 at a higher position in the labyrinth groove 460 above the RF bias housing arm 434 when the cantilevered assembly is in a high position (small gap 410 a). FIG. 4C shows the movable shield plate 458 at a lower position in the labyrinth groove 460 above the RF bias housing arm 434 when the cantilevered assembly is in a low position (large gap 410 c). FIG. 4B shows the movable shield plate 458 in a neutral or mid position within the labyrinth groove 460 when the cantilevered assembly is in a mid position (medium gap 410 b). While the labyrinth seal 448 is shown as symmetrical about the RF bias housing arm 434, in other embodiments the labyrinth seal 448 may be asymmetrical about the RF bias arm 434.

Figure 5:
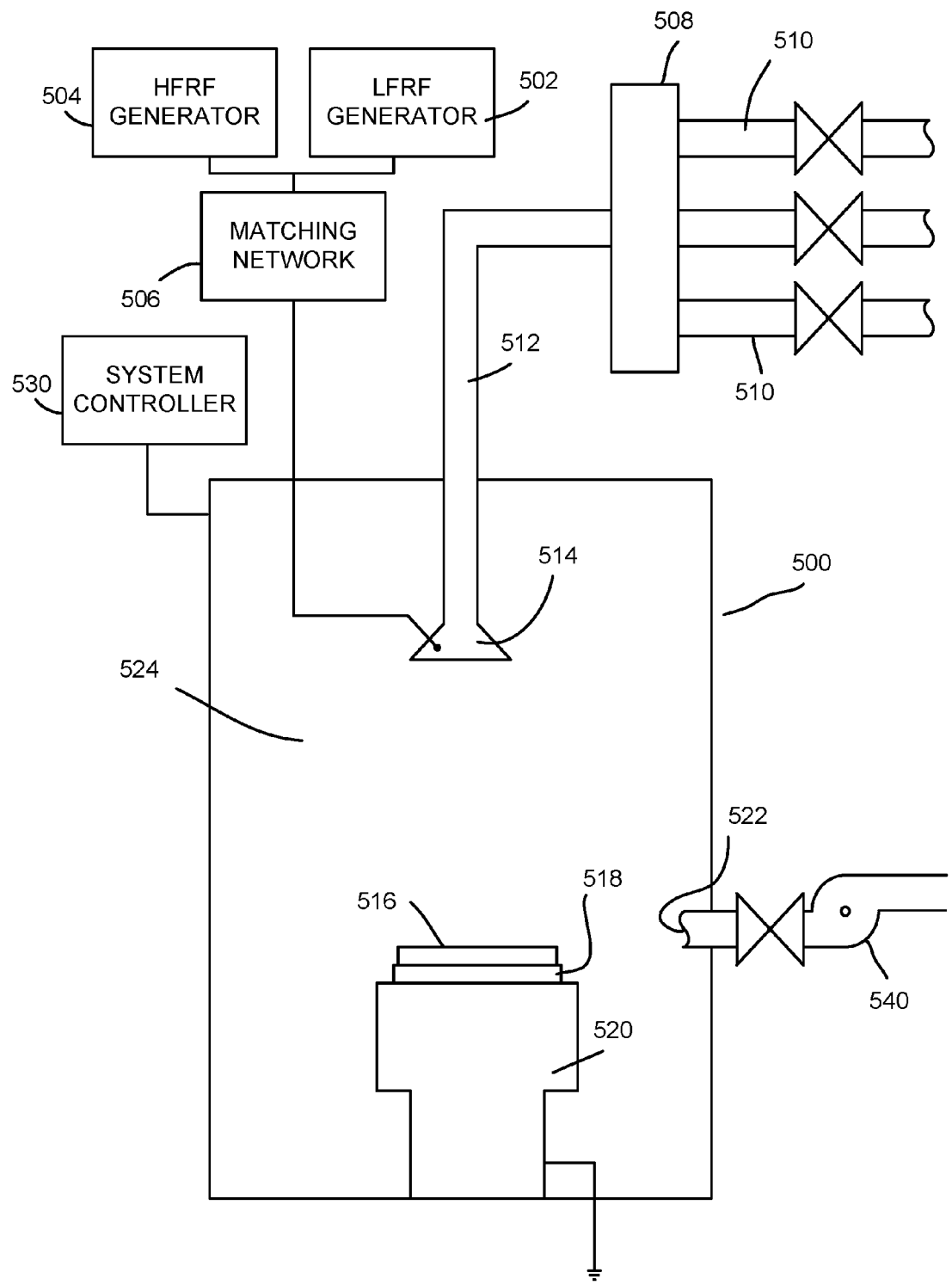
FIG. 5 depicts a reaction chamber that may be used to perform the deposition processes described herein according to certain embodiments.

FIG. 5 provides a simple block diagram depicting various reactor components arranged for implementing deposition methods described herein. As shown, a reactor 500 includes a process chamber 524 that encloses other components of the reactor and serves to contain a plasma generated by a capacitive-discharge type system including a showerhead 514 working in conjunction with a grounded heater block 520. A high frequency (HF) radio frequency (RF) generator 504 and a low frequency (LF) RF generator 502 may be connected to a matching network 506 and to the showerhead 514. The power and frequency supplied by matching network 506 may be sufficient to generate a plasma from process gases supplied to the process chamber 524. For example, the matching network 506 may provide 50 W to 500 W of HFRF power. In some examples, the matching network 506 may provide 100 W to 5000 W of HFRF power and 100 W to 5000 W of LFRF power total energy. In a typical process, the HFRF component may generally be between 5 MHz to 60 MHz, e.g., 13.56 MHz. In operations where there is an LF component, the LF component may be from about 100 kHz to 2 MHz, e.g., 430 kHz.

Within the reactor, a wafer pedestal 518 may support a substrate 516. The wafer pedestal 518 may include a chuck, a fork, or lift pins (not shown) to hold and transfer the substrate during and between the deposition and/or plasma treatment reactions. The chuck may be an electrostatic chuck, a mechanical chuck, or various other types of chuck as are available for use in the industry and/or for research.

Various process gases may be introduced via inlet 512. Multiple source gas lines 510 are connected to manifold 508. The gases may be premixed or not. Appropriate valving and mass flow control mechanisms may be employed to ensure that the correct process gases are delivered during the deposition and plasma treatment phases of the process. In the case where a chemical precursor(s) is delivered in liquid form, liquid flow control mechanisms may be employed. Such liquids may then be vaporized and mixed with process gases during transportation in a manifold heated above the vaporization point of the chemical precursor supplied in liquid form before reaching the deposition chamber.

Process gases may exit chamber 524 via an outlet 522. A vacuum pump, e.g., a one or two stage mechanical dry pump and/or turbomolecular pump 540, may be used to draw process gases out of the process chamber 524 and to maintain a suitably low pressure within the process chamber 524 by using a closed-loop-controlled flow restriction device, such as a throttle valve or a pendulum valve.

As discussed above, the techniques for deposition discussed herein may be implemented on a multi-station or single station tool. In specific implementations, a 300 mm Lam Vector™ tool having a 4-station deposition scheme or a 200 mm Sequel tool having a 6-station deposition scheme may be used. In some implementations, tools for processing 450 mm wafers may be used. In various implementations, the wafers may be indexed after every deposition and/or post-deposition plasma treatment, or may be indexed after etching operations if the etching chambers or stations are also part of the same tool, or multiple depositions and treatments may be conducted at a single station before indexing the wafer.

In some embodiments, an apparatus may be provided that is configured to perform the techniques described herein. A suitable apparatus may include hardware for performing various process operations as well as a system controller 530 having instructions for controlling process operations in accordance with the disclosed embodiments. The system controller 530 will typically include one or more memory devices and one or more processors communicatively connected with various process control equipment, e.g., valves, RF generators, wafer handling systems, etc., and configured to execute the instructions so that the apparatus will perform a technique in accordance with the disclosed embodiments. Machine-readable media containing instructions for controlling process operations in accordance with the present disclosure may be coupled to the system controller 530. The controller 530 may be communicatively connected with various hardware devices, e.g., mass flow controllers, valves, RF generators, vacuum pumps, etc. to facilitate control of the various process parameters that are associated with the deposition operations as described herein.

In some embodiments, a system controller 530 may control all of the activities of the reactor 500. The system controller 530 may execute system control software stored in a mass storage device, loaded into a memory device, and executed on a processor. The system control software may include instructions for controlling the timing of gas flows, wafer movement, RF generator activation, etc., as well as instructions for controlling the mixture of gases, the chamber and/or station pressure, the chamber and/or station temperature, the wafer temperature, the target power levels, the RF power levels, the substrate pedestal, chuck, and/or susceptor position, and other parameters of a particular process performed by the reactor apparatus 500. The system control software may be configured in any suitable way. For example, various process tool component subroutines or control objects may be written to control operation of the process tool components necessary to carry out various process tool processes. The system control software may be coded in any suitable computer readable programming language.

The system controller 530 may typically include one or more memory devices and one or more processors configured to execute the instructions so that the apparatus will perform a technique in accordance with the present disclosure. Machine-readable media containing instructions for controlling process operations in accordance with disclosed embodiments may be coupled to the system controller 530.

Figure 6:
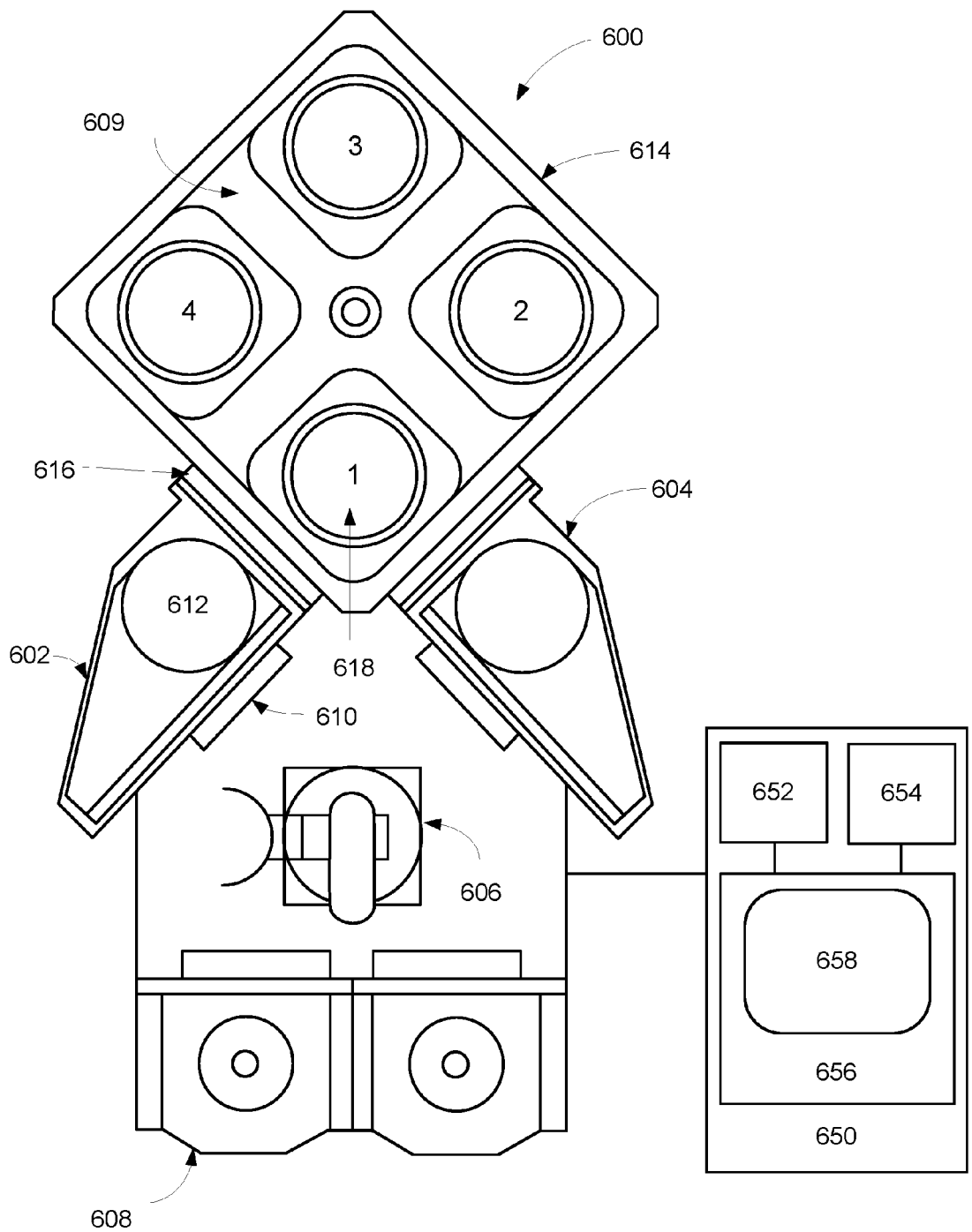
FIG. 6 shows a multi-station apparatus that may be used to perform the deposition processes in certain implementations.

One or more process stations may be included in a multi-station processing tool. FIG. 6 shows a schematic view of an embodiment of a multi-station processing tool 600 with an inbound load lock 602 and an outbound load lock 604, either or both of which may include a remote plasma source. A robot 606, at atmospheric pressure, is configured to move wafers from a cassette loaded through a pod 608 into inbound load lock 602 via an atmospheric port 610. A wafer is placed by the robot 606 on a pedestal 612 in the inbound load lock 602, the atmospheric port 610 is closed, and the load lock is pumped down. Where the inbound load lock 602 includes a remote plasma source, the wafer may be exposed to a remote plasma treatment in the load lock prior to being introduced into a processing chamber 614. Further, the wafer also may be heated in the inbound load lock 602 as well, for example, to remove moisture and adsorbed gases. Next, a chamber transport port 616 to processing chamber 614 is opened, and another robot (not shown) places the wafer into the reactor on a pedestal of a first station shown in the reactor for processing. While the embodiment depicted includes load locks, it will be appreciated that, in some embodiments, direct entry of a wafer into a process station may be provided.

The depicted processing chamber 614 includes four process stations, numbered from 1 to 4 in the embodiment shown in FIG. 6. Each station has a heated pedestal (shown at 618 for station 1), and gas line inlets. It will be appreciated that in some embodiments, each process station may have different or multiple purposes. For example, each of the process stations 1-4 may be a chamber for performing one or more of ALD, CVD, CFD, or etching (any of which may be plasma assisted). In one embodiment, at least one of the process stations is a deposition station having a reaction chamber as shown in FIG. 5, and at least one of the other process stations is an etching station having a reaction chamber as shown in FIGS. 4A-4C. While the depicted processing chamber 614 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 6 also depicts an embodiment of a wafer handling system 609 for transferring wafers within processing chamber 614. In some embodiments, wafer handling system 609 may transfer wafers between various process stations and/or between a process station and a load lock. It will be appreciated that any suitable wafer handling system may be employed. Non-limiting examples include wafer carousels and wafer handling robots. FIG. 6 also depicts an embodiment of a system controller 650 employed to control process conditions and hardware states of process tool 600. System controller 650 may include one or more memory devices 656, one or more mass storage devices 654, and one or more processors 652. Processor 652 may include a CPU or computer, analog and/or digital input/output connections, stepper motor controller boards, etc.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing operations during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing operations to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing operations to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process operation or operations to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

In certain embodiments, the controller has instructions to perform the operations shown and described in relation to FIG. 2. For example, the controller may have instructions to cyclically (a) perform an etching operation to partially etch a feature on a substrate, and (b) deposit a protective sidewall coating in the etched feature without substantially etching the substrate. The instructions may relate to performing these processes using the disclosed reaction conditions. The instructions may also relate to transferring the substrate between etching and deposition chambers in some implementations.

Returning to the embodiment of FIG. 6, in some embodiments, system controller 650 controls all of the activities of process tool 600. System controller 650 executes system control software 658 stored in mass storage device 654, loaded into memory device 656, and executed on processor 652. Alternatively, the control logic may be hard coded in the controller 650. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 658 may include instructions for controlling the timing, mixture of gases, chamber and/or station pressure, chamber and/or station temperature, wafer temperature, target power levels, RF power levels, RF exposure time, substrate pedestal, chuck and/or susceptor position, and other parameters of a particular process performed by process tool 600. System control software 658 may be configured in any suitable way. For example, various process tool component subroutines or control objects may be written to control operation of the process tool components necessary to carry out various process tool processes. System control software 658 may be coded in any suitable computer readable programming language.

In some embodiments, system control software 658 may include input/output control (IOC) sequencing instructions for controlling the various parameters described above. For example, each phase of a CFD process may include one or more instructions for execution by system controller 650. The instructions for setting process conditions for an ALD process phase may be included in a corresponding ALD recipe phase. In some embodiments, the ALD recipe phases may be sequentially arranged, so that all instructions for an ALD process phase are executed concurrently with that process phase.

Other computer software and/or programs stored on mass storage device 654 and/or memory device 656 associated with system controller 650 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 618 and to control the spacing between the substrate and other parts of process tool 600.

A process gas control program may include code for controlling gas composition and flow rates and optionally for flowing gas into one or more process stations prior to deposition in order to stabilize the pressure in the process station. In some embodiments, the controller includes instructions for depositing a nanolaminate protective layer on a core layer, and depositing a conformal layer over the protective layer.

A pressure control program may include code for controlling the pressure in the process station by regulating, for example, a throttle valve in the exhaust system of the process station, a gas flow into the process station, etc. In some embodiments, the controller includes instructions for depositing a nanolaminate protective layer on a core layer, and depositing a conformal layer over the protective layer.

A heater control program may include code for controlling the current to a heating unit that is used to heat the substrate. Alternatively, the heater control program may control delivery of a heat transfer gas (such as helium) to the substrate. In certain implementations, the controller includes instructions for depositing a nanolaminate protective layer at a first temperature, and a conformal layer over the protective layer at a second temperature, where the second temperature is higher than the first temperature.

A plasma control program may include code for setting RF power levels and exposure times in one or more process stations in accordance with the embodiments herein. In some embodiments, the controller includes instructions for depositing a nanolaminate protective layer at a first RF power level and RF duration, and depositing a conformal layer over the protective layer at a second RF power level and RF duration. The second RF power level and/or the second RF duration may be higher/longer than the first RF power level/duration.

In some embodiments, there may be a user interface associated with system controller 650. The user interface may include a display screen, graphical software displays of the apparatus and/or process conditions, and user input devices such as pointing devices, keyboards, touch screens, microphones, etc.

In some embodiments, parameters adjusted by system controller 650 may relate to process conditions. Non-limiting examples include process gas composition and flow rates, temperature, pressure, plasma conditions (such as RF bias power levels and exposure times), etc. These parameters may be provided to the user in the form of a recipe, which may be entered utilizing the user interface.

Signals for monitoring the process may be provided by analog and/or digital input connections of system controller 650 from various process tool sensors. The signals for controlling the process may be output on the analog and digital output connections of process tool 600. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 650 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller will typically include one or more memory devices and one or more processors configured to execute the instructions so that the apparatus will perform a method in accordance with the disclosed embodiments. Machine-readable, non-transitory media containing instructions for controlling process operations in accordance with the disclosed embodiments may be coupled to the system controller.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Figure 7:
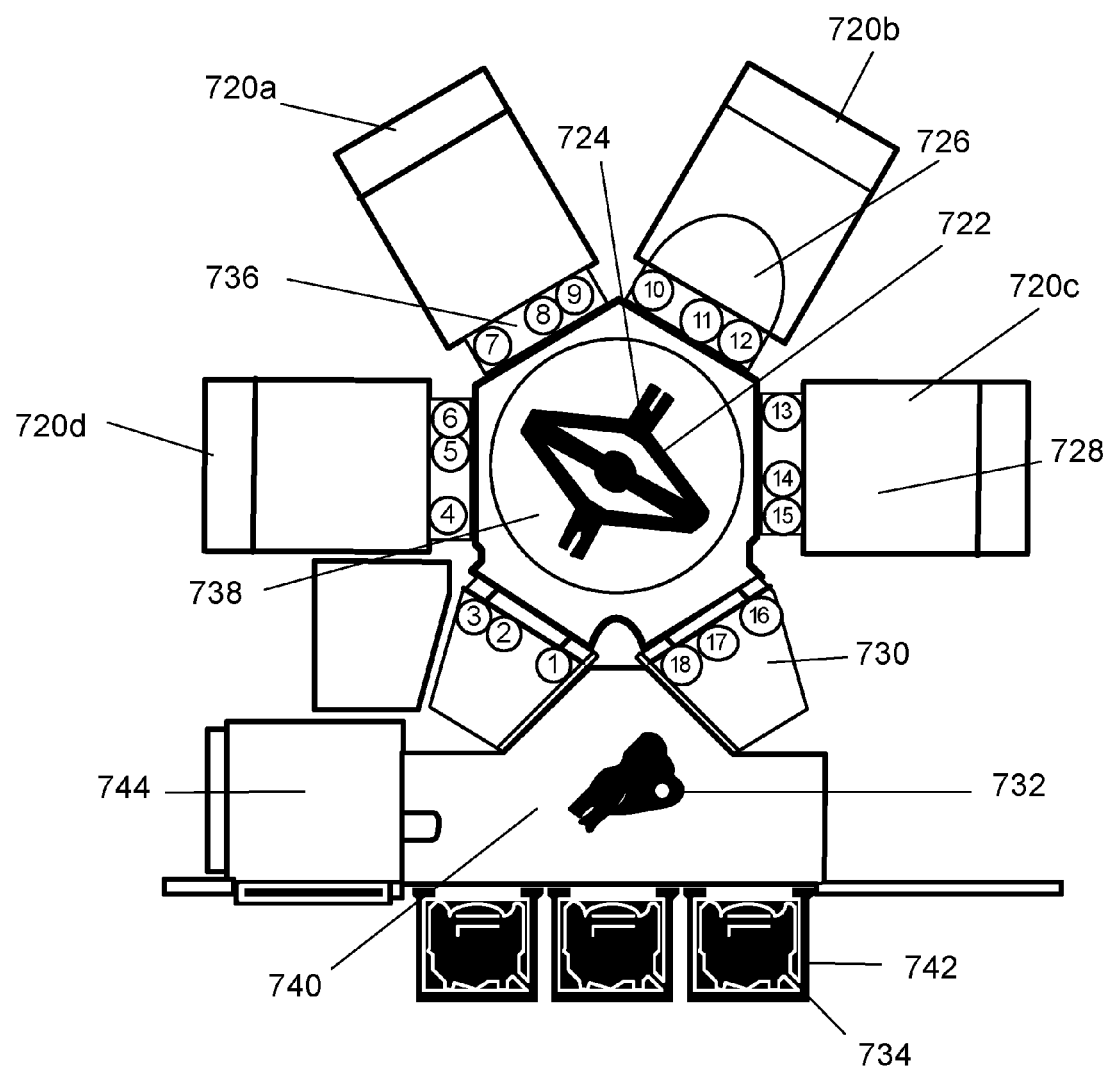
FIG. 7 presents a cluster tool that may be used to practice both deposition and etching according to certain embodiments.

FIG. 7 depicts a semiconductor process cluster architecture with various modules that interface with a vacuum transfer module 738 (VTM). The arrangement of transfer modules to "transfer" substrates among multiple storage facilities and processing modules may be referred to as a "cluster tool architecture" system. Airlock 730, also known as a loadlock or transfer module, is shown in VTM 738 with four processing modules 720a-720d, which may be individual optimized to perform various fabrication processes. By way of example, processing modules 720a-720d may be implemented to perform substrate etching, deposition, ion implantation, substrate cleaning, sputtering, and/or other semiconductor processes as well as laser metrology and other defect detection and defect identification methods. One or more of the processing modules (any of 720a-720d) may be implemented as disclosed herein, i.e., for etching recessed features into substrates, depositing protective films on sidewalls of recessed features, and other suitable functions in accordance with the disclosed embodiments. Airlock 730 and process modules 720a-720d may be referred to as "stations." Each station has a facet 736 that interfaces the station to VTM 738. Inside the facets, sensors 1-18 are used to detect the passing of substrate 726 when moved between respective stations.

Robot 722 transfers substrates between stations. In one implementation, the robot may have one arm, and in another implementation, the robot may have two arms, where each arm has an end effector 724 to pick substrates for transport. Front-end robot 732, in atmospheric transfer module (ATM) 740, may be used to transfer substrates from cassette or Front Opening Unified Pod (FOUP) 734 in Load Port Module (LPM) 742 to airlock 730. Module center 728 inside process modules 720a-720d may be one location for placing the substrate. Aligner 744 in ATM 740 may be used to align substrates.

In an exemplary processing method, a substrate is placed in one of the FOUPs 734 in the LPM 742. Front-end robot 732 transfers the substrate from the FOUP 734 to the aligner 744, which allows the substrate 726 to be properly centered before it is etched, or deposited upon, or otherwise processed. After being aligned, the substrate is moved by the front-end robot 732 into an airlock 730. Because airlock modules have the ability to match the environment between an ATM and a VTM, the substrate is able to move between the two pressure environments without being damaged. From the airlock module 730, the substrate is moved by robot 722 through VTM 738 and into one of the process modules 720a-720d, for example process module 720a. In order to achieve this substrate movement, the robot 722 uses end effectors 724 on each of its arms. In process module 720a, the substrate undergoes etching as described herein to form a partially etched feature. Next, the robot 722 moves the substrate out of processing module 720a, into the VTM 738, and then into a different processing module 720b. In processing module 720b, a protective film is deposited on sidewalls of the partially etched feature. Then, the robot 722 moves the substrate out of processing module 720b, into the VTM 738, and into processing module 720a, where the partially etched feature is further etched. The etching/deposition can be repeated until the feature is fully etched.

It should be noted that the computer controlling the substrate movement can be local to the cluster architecture, or can be located external to the cluster architecture in the manufacturing floor, or in a remote location and connected to the cluster architecture via a network.

Lithographic patterning of a film typically comprises some or all of the following operations, each operation enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

What is claimed is:

1. A method of forming an etched feature in a stack comprising a dielectric material on a semiconductor substrate, the method comprising:
   (a) generating a first plasma comprising an etching reactant, exposing the substrate to the first plasma, and partially etching the feature in the stack;
   (b) after (a), depositing a protective film comprising boron nitride on sidewalls of the feature, wherein the protective film is deposited through a plasma assisted chemical vapor deposition reaction comprising exposing the substrate to a first deposition reactant and a second deposition reactant while the substrate is exposed to a second plasma, wherein the first deposition reactant comprises a boron-containing reactant, the second deposition reactant comprises a nitrogen-containing reactant, the first deposition reactant and second deposition reactant each having sticking coefficients of about 0.05 or less under conditions used to deposit the protective film, wherein the second plasma drives a reaction that results in deposition of the protective film on sidewalls of the feature; and
   (c) repeating (a)-(b) until the feature is etched to a final depth, wherein (a) further comprises oxidizing the protective film from boron nitride to boron oxide, wherein the protective film deposited in (b) and oxidized in (a) substantially prevents lateral etch of the feature during (a), and wherein the feature has an aspect ratio of about 5 or greater at its final depth.

2. The method of claim 1, wherein at the final depth, the feature has an aspect ratio of about 20 or greater, and a bow of about 20% or less.

3. The method of claim 1, wherein the feature is formed while forming a VNAND device, and wherein the stack comprises alternating layers of (i) an oxide material, and (ii) a nitride material or polysilicon material.

4. The method of claim 1, wherein the feature is formed while forming a DRAM device, and wherein the dielectric material comprises silicon oxide.

5. The method of claim 1, wherein the first deposition reactant comprises $BCl_3$, wherein the second deposition reactant comprises $N_2$ and $H_2$, wherein the etch reactant in (a) comprises one or more fluorocarbons and $O_2$, and further comprising during (a) oxidizing the boron nitride protective film to form boron oxide.

6. The method of claim 1, wherein the first deposition reactant comprises $BCl_3$, wherein the second deposition reactant comprises $N_2$ and $H_2$, and wherein the etching reactant in (a) comprises one or more fluorocarbons and $O_2$.

7. The method of claim 1, wherein the feature has an aspect ratio of about 50 or greater.

8. The method of claim 1, wherein (a) and (b) are repeated at least twice.

9. An apparatus for forming an etched feature in dielectric material on a semiconductor substrate, the apparatus comprising:
   one or more reaction chambers, wherein at least one reaction chamber is designed or configured to perform etching, and wherein at least one reaction chamber is designed or configured to perform deposition, each reaction chamber comprising:
      an inlet for introducing process gases to the reaction chamber,
      an outlet for removing material from the reaction chamber, and
      a plasma source; and
   a controller configured to cause:
   (a) generating a first plasma comprising an etching reactant, exposing the substrate to the first plasma, and partially etching the feature in the dielectric material, wherein (a) is performed in the reaction chamber designed or configured to perform etching;
   (b) after (a), depositing a protective film comprising boron nitride on sidewalls of the feature through a plasma assisted chemical vapor deposition reaction comprising exposing the substrate to a first deposition reactant and a second deposition reactant while the substrate is exposed to a second plasma, wherein the first deposition reactant comprises a boron-containing reactant, the second deposition reactant comprises a nitrogen-containing reactant, the first deposition reactant and second deposition reactant each having sticking coefficients of about 0.05 or less under conditions used to deposit the protective film, wherein the second plasma drives a reaction that results in deposition of the protective film on sidewalls of the feature, and wherein (b) is performed in the reaction chamber designed or configured to perform deposition; and
   (c) repeating (a)-(b) until the feature is etched to a final depth, wherein (a) further comprises oxidizing the protective film from boron nitride to boron oxide, wherein the protective film deposited in (b) and oxidized in (a) substantially prevents lateral etch of the feature during (a), and wherein the feature has an aspect ratio of about 5 or greater at its final depth.

10. The apparatus of claim 9, wherein the reaction chamber designed or configured to perform etching is the same reaction chamber designed or configured to perform deposition, such that both (a) and (b) occur in the same reaction chamber.

11. The apparatus of claim 9, wherein the reaction chamber designed or configured to perform etching is different from the reaction chamber designed or configured to perform deposition, and wherein the controller further comprises instructions to transfer the substrate between the reaction chamber designed or configured to perform etching and the reaction chamber designed or configured to perform deposition.

* * * * *